(12) United States Patent
Jang et al.

(10) Patent No.: US 11,531,871 B2
(45) Date of Patent: Dec. 20, 2022

(54) STACKED NEUROMORPHIC DEVICES AND NEUROMORPHIC COMPUTING SYSTEMS

(71) Applicant: SAMSUNG ELECTRONICS CO., LTD., Suwon-si (KR)

(72) Inventors: Jaehun Jang, Suwon-si (KR); Hongrak Son, Suwon-si (KR); Changkyu Seol, Suwon-si (KR); Geunyeong Yu, Suwon-si (KR); Chanho Yoon, Suwon-si (KR); Pilsang Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 427 days.

(21) Appl. No.: 16/854,942

(22) Filed: Apr. 22, 2020

(65) Prior Publication Data

US 2021/0125045 A1  Apr. 29, 2021

(30) Foreign Application Priority Data

Oct. 29, 2019  (KR) .......................... 10-2019-0135613

(51) Int. Cl.
*G06N 3/04* (2006.01)
*H01L 25/18* (2006.01)
*G06N 3/063* (2006.01)
*H01L 25/065* (2006.01)

(52) U.S. Cl.
CPC .............. *G06N 3/063* (2013.01); *G06N 3/04* (2013.01); *H01L 25/0652* (2013.01); *H01L 25/18* (2013.01); *H01L 2225/06541* (2013.01)

(58) Field of Classification Search
CPC .......... G06N 3/063; G06N 3/04; G06N 3/049; G06N 3/088; G06N 3/0454; G06N 3/0635; G06N 3/08; G06N 20/00; H01L 25/0652; H01L 25/18; H01L 2225/06541; H01L 25/0657; H01L 2224/16145; H01L 2224/16227; H01L 2224/17181; H01L 2225/06513; H01L 2225/06517
See application file for complete search history.

(56) References Cited

U.S. PATENT DOCUMENTS

| | | | |
|---|---|---|---|
| 9,698,790 B2 | 7/2017 | Roberts | |
| 10,283,178 B2 | 5/2019 | Takahashi | |
| 2016/0181322 A1* | 6/2016 | Mazed ..................... | H01L 25/18 257/2 |
| 2016/0379115 A1 | 12/2016 | Burger et al. | |
| 2017/0140821 A1 | 5/2017 | Mazed | |
| 2017/0154257 A1 | 6/2017 | Cao et al. | |

(Continued)

*Primary Examiner* — Kyoung Lee
(74) *Attorney, Agent, or Firm* — Volentine, Whitt & Francos, PLLC

(57) ABSTRACT

A stacked neuromorphic device includes a logic die including a control circuit and configured to communicate with a host, and core dies stacked on the logic die and connected to the logic die via through silicon vias (TSVs) extending through the core dies. The core dies include a neuromorphic core die including a synapse array connected to row lines and column lines. The synapse array includes synapses configured to store weights and perform a calculation based on the weights and input data. The weights are included in layers of a neural network system. And the control circuit provides the weights to the neuromorphic core die through the TSVs and controls data transmission by the neuromorphic core die.

20 Claims, 20 Drawing Sheets

(56) References Cited

U.S. PATENT DOCUMENTS

| | | |
|---|---|---|
| 2018/0046908 A1 | 2/2018 | Cox et al. |
| 2019/0042912 A1 | 2/2019 | Teig et al. |
| 2019/0065941 A1 | 2/2019 | Yoo et al. |

* cited by examiner

310a

310a

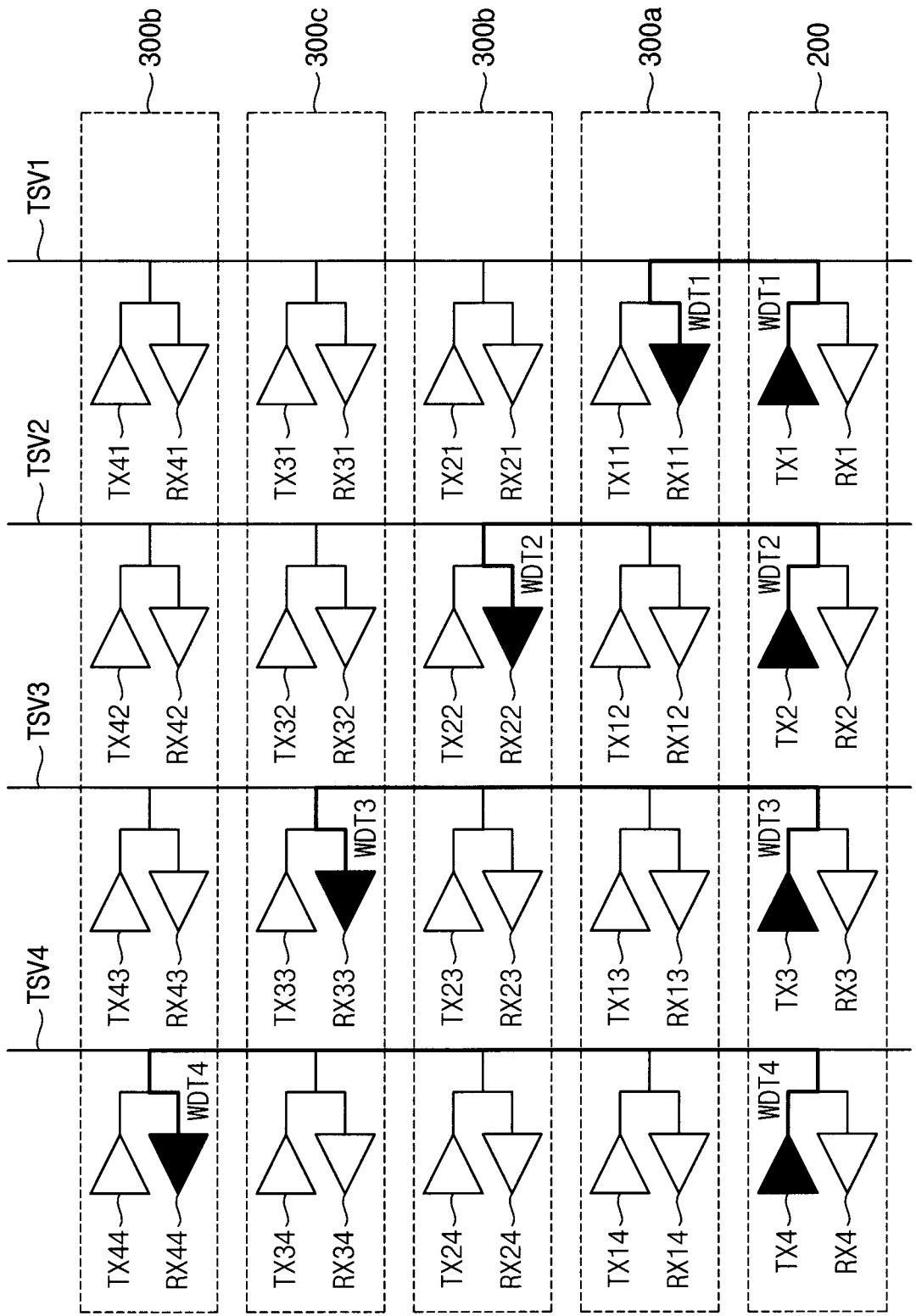

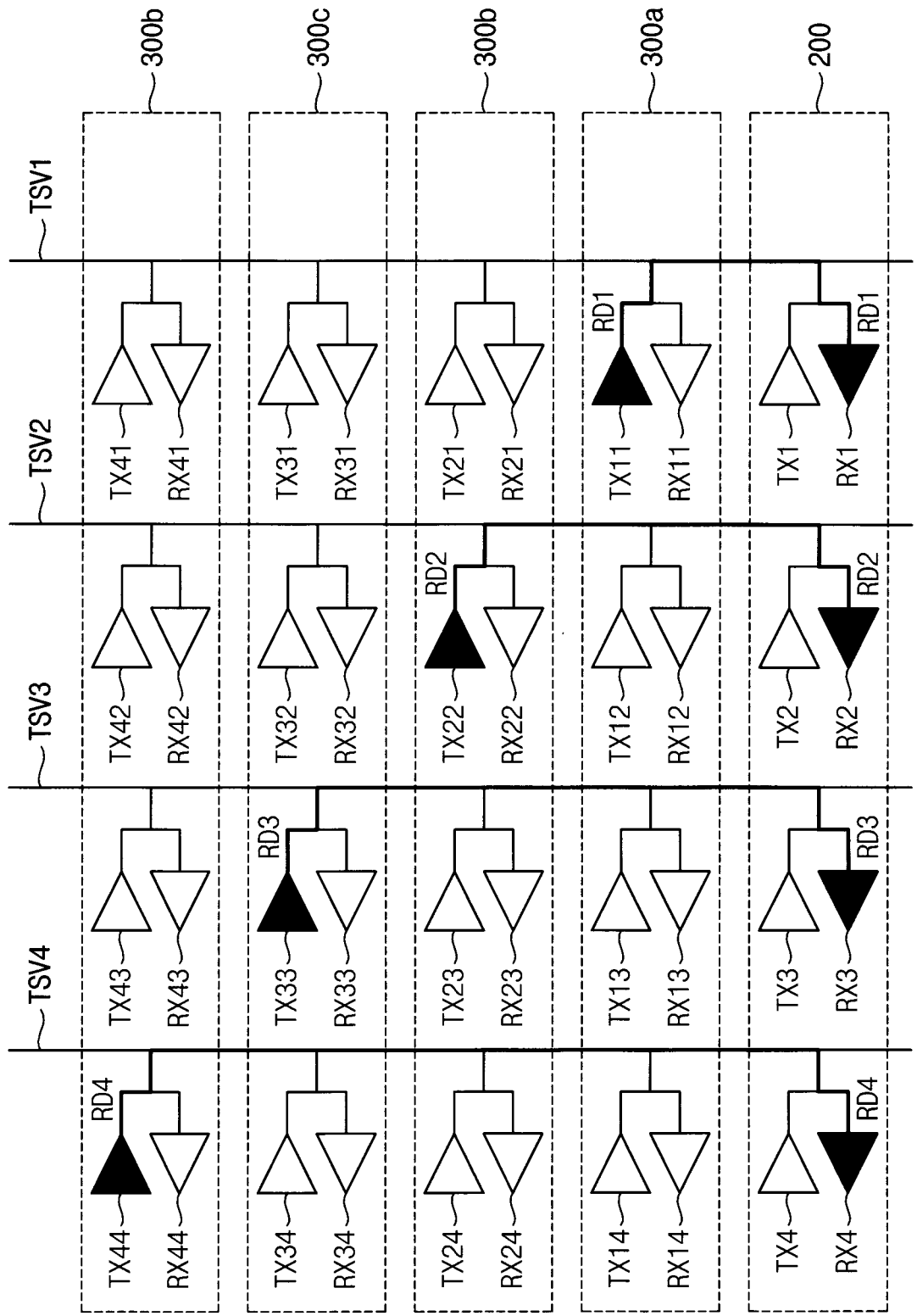

STACKED NEUROMORPHIC DEVICES AND NEUROMORPHIC COMPUTING SYSTEMS

CROSS-REFERENCE TO RELATED APPLICATION

This application claims priority under 35 USC § 119 to Korean Patent Application No. 10-2019-0135613 filed on Oct. 29, 2019 in the Korean Intellectual Property Office, the subject matter of which is hereby incorporated by reference.

BACKGROUND

1. Technical Field

Exemplary embodiments relate generally to artificial intelligence, and more particularly to stacked neuromorphic devices and neuromorphic computing systems.

2. Discussion of the Related Art

The human brain includes hundreds of billions of neurons that are vastly interconnected to form a complicated neural network. Neurons provide intellectual capabilities associated with learning and memory. Neurons use their synapses to exchange signals with thousands of other neurons in the neural network. Thus, neurons are the structural and functional base units for data transmission across the neural network. A synapse refers to a junction between two neurons at which an axon of a first neuron and a dendrite of a second neuron are disposed proximate to one another in order to exchange signals. A single neuron is generally connected with thousands of other neurons via synapses.

A neuromorphic chip refers to a semiconductor circuit that is designed to mimic the operation of a biological nervous system (i.e., a biological neural network). A neuromorphic chip may be used to implement an intelligent system that is capable of adapting itself to an unspecified environment.

SUMMARY

Some exemplary embodiments provide a stacked neuromorphic device capable of enhancing performance by employing a stacked configuration.

Some exemplary embodiments provide a neuromorphic computing system capable of enhancing performance by employing a stacked configuration.

According to exemplary embodiments, a stacked neuromorphic device includes; a logic die configured to communicate with a host, a plurality of core dies stacked on the logic die and connected to the logic die through a plurality of through silicon vias (TSVs) extending through the plurality of core dies. The plurality of core dies includes neuromorphic core dies, and the neuromorphic core dies including a synapse array connected to a plurality of row lines and a plurality of column lines. The synapse array includes a plurality of synapses configured to store weights and perform a calculation based on the weights and an input data, the weights being included in a plurality of layers of a neural network system, and the logic die includes a control circuit configured to provide the weights to the neuromorphic core die through the TSVs and to control data transmission among the neuromorphic core dies.

According to exemplary embodiments, a neuromorphic computing system includes a host and at least one stacked neuromorphic device. The at least one stacked neuromorphic device includes; a logic die configured to communicate with the host, a plurality of core dies stacked on the logic die, and a plurality of through silicon vias (TSVs) extending through the plurality of memory dies to connect to the plurality of memory dies to the logic die. The at least one of the plurality of core dies includes neuromorphic core dies, and the neuromorphic core dies respectively including a synapse array connected to a plurality of row lines and a plurality of column lines. The synapse array includes a plurality of synapses configured to store weights and to perform a calculation based on the weights and an input data, the weights are included in a plurality of layers constituting a neural network system, and the logic die includes a control circuit configured to provide the weights to the neuromorphic core dies through the TSVs and to control data transmission among the neuromorphic core dies.

According to exemplary embodiments, a stacked neuromorphic device includes a logic die configured to communicate with a host, core dies stacked on the logic die, and through silicon vias (TSVs) extending through the core dies to connect the core dies to the logic die. The core dies respectively include neuromorphic core dies, and each of the neuromorphic core dies includes a synapse array connected to a plurality of row lines and a plurality of column lines. The synapse array includes a plurality of synapses configured to store weights and configured to perform a calculation based on the weights and an input data, the weights are included in a plurality of layers of a neural network system, and the logic die includes a control circuit configured to provide the weights to the neuromorphic core dies through the TSVs and to control data transmission among the neuromorphic core dies. The neuromorphic core dies respective include a data processor connected to the synapse array and configured to provide an accumulation result of the accumulation operation to the control circuit through the TSVs, the control circuit includes an input/output interface configured to communicate with the host, and a layer controller configured to control the data transmission among the neuromorphic core dies.

Accordingly, the stacked neuromorphic device includes a logic die to communicate with a host and a plurality of neuromorphic core dies stacked on the logic die. Each of the neuromorphic core dies performs artificial intelligence calculation to enhance performance.

BRIEF DESCRIPTION OF THE DRAWINGS

Illustrative, non-limiting exemplary embodiments will be more clearly understood from the following detailed description in conjunction with the accompanying drawings.

FIGS. 20A and 20B are respective diagrams illustrating possible implementations for the data transfer path of FIG. 19.

DETAILED DESCRIPTION

Exemplary embodiments will be described in some additional detail with reference to the accompanying drawings.

An artificial intelligence (AI) system is a computer system that implements human-like intelligence. Unlike existing rules-based computing systems, an AI system may make judgements, learn from the judgement making (deep-learning or machine learning) process, and become more capable (or smart). As an AI system are used, its recognition capabilities improve and user preferences are more accurately identified. As a result of these promising capabilities, existing rules-based computing systems are increasingly being replaced by deep-learning-based AI systems.

AI technology may be understood as including machine learning and element technology utilizing machine learning. Machine learning is an algorithm-based technology that essentially classifies (or learns) the characteristics of input data. Element technology simulates functions such as recognition and judgment of the human brain using machine learning. For example, element technology may include linguistic understanding, visual understanding, reasoning and prediction, knowledge representation, motion control, etc.

Figure 1:
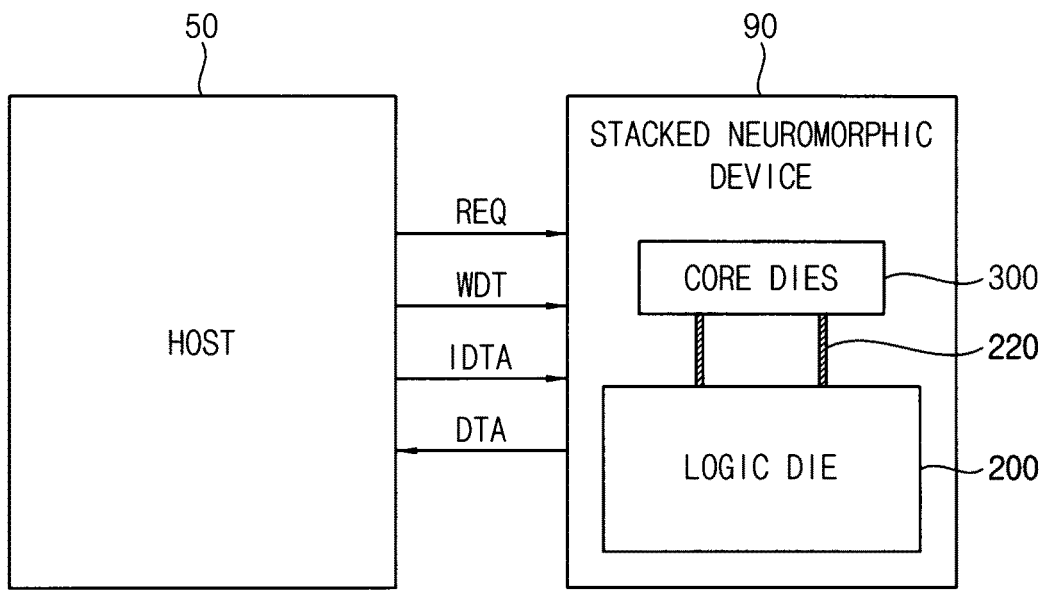
FIG. 1 is a block diagram illustrating an electronic device (e.g., a neuromorphic computing system) according to exemplary embodiments.

Figure (FIG. 1 is a block diagram illustrating an electronic device (i.e., a neuromorphic computing system) 10 according to exemplary embodiments, where the neuromorphic computing system 10 includes a host 50 and a stacked neuromorphic device 90.

The stacked neuromorphic device 90 may include a logic die 200 and a plurality of core dies 300 stacked on the logic die 200. The core dies 300 may store weights. The logic die 200 and the core dies 300 may be sequentially stacked one on top of the other. The core dies 300 stacked on the logic die 200 may be electrically connected to the logic die 200 through various conducting elements 220 (e.g., wiring patterns, through silicon vias, etc.).

The stacked neuromorphic device 90 may receive a request REQ, weights WDT and an input data IDTA from the host 50. The stacked neuromorphic device 90 may store the weights WDT and provide a final data DTA to the host 50. Some of the core dies 300 may include neuromorphic core dies and each of the neuromorphic core dies may include a synapse array. The synapse array may include a plurality of synapses capable of storing the weights WDT and performing various operations based on the weights WDT and the input data IDTA. The weights WDT may be included in a plurality of layers constituting a neural network system.

The logic die 200 may include a control circuit 201 and the control circuit 201 may provide the weights WDT to the neuromorphic core dies through the conducting elements 220 and may control data transmission among the neuromorphic core dies.

Figure 2:
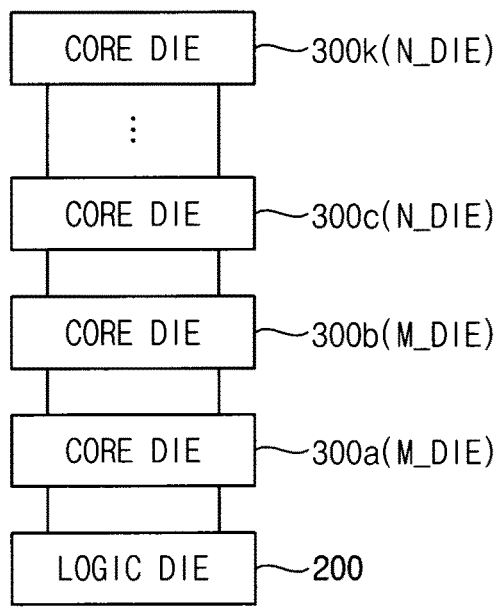
FIG. 2 is a block diagram further illustrating an example of the stacked neuromorphic device of FIG. 1 according to exemplary embodiments.

FIG. 2 is a block diagram illustrating an example of the stacked neuromorphic device 90 of FIG. 1 according to exemplary embodiments.

Referring to FIG. 2, the stacked neuromorphic device 90 may include the logic die 200 and a plurality of core dies 300a~300k, where 'a' is an integer and 'k' is an integer greater than two. IN FIG. 2, the logic die 200 and the core dies 200a~200k are shown sequentially stacked on each other. The core dies 300a~300k stacked on the logic die 200 may be variously, electrically connected to the logic die 200 through the conducting elements 220.

In exemplary embodiments, at least some of the core dies 300a~300k may include memory core dies (M_DIE) 300a and 300b. One or more of the core dies 300a~300k may include neuromorphic core dies (N_DIE) 300c~300k. The memory core dies 300a and 300b may store the result(s) of various calculations performed by the neuromorphic core dies 300c~300k. Each of the memory core dies 300a and 300b may include volatile memory cells and/or nonvolatile memory cells.

Figure 3:
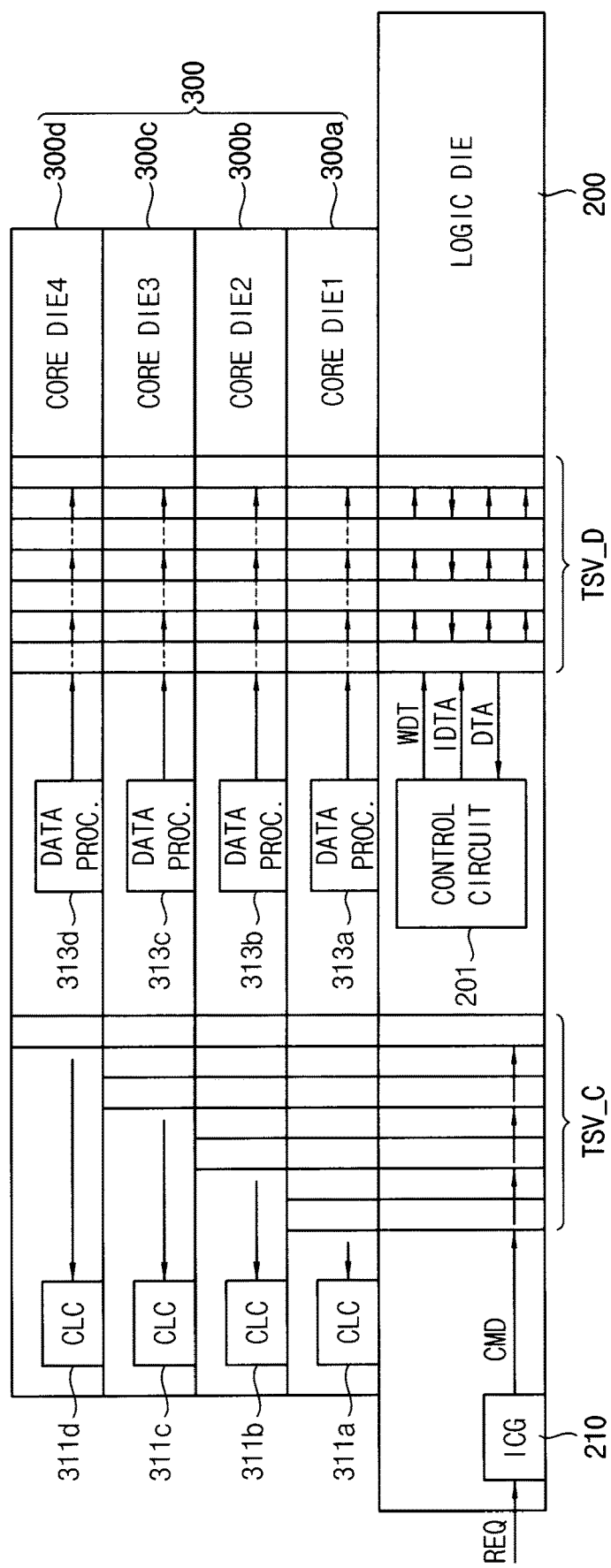
FIG. 3 is a block diagram further illustrating an example of the stacked neuromorphic device of FIG. 2 according to exemplary embodiments.

FIG. 3 is a block diagram illustrating an example (90a) of the stacked neuromorphic device 90 of FIG. 2 according to exemplary embodiments.

Referring to FIG. 3, the stacked neuromorphic device 90a may include a plurality of layers. For example, the stacked neuromorphic device 90a may include the logic die 200 and one or more neuromorphic core dies 300 stacked on logic die 200. In the example of FIG. 3, although first, second, third and fourth neuromorphic core dies 300a to 300d are illustrated, the number and arrangement of neuromorphic core dies may vary with design. For example, the logic die 200 may be disposed between two or more of the neuromorphic core dies 300, or may be disposed on the one or more of the neuromorphic core dies 300.

The logic die 200 may variously communicate (e.g., send and/or receive information) with the host 50 and the neuromorphic core dies 300. Thus, the logic die 200 may receive one or more request(s) REQ and one or more weights WDT from the host 50, and provide the neuromorphic core dies 300 with the weights WDT and one or more command(s) CMD in response to the received request REQ.

In exemplary embodiments, the logic die 200 and the neuromorphic core dies 300 may be fabricated through different processes.

In the illustrated exemplary embodiment of FIG. 3, the logic die 200 may include an internal command generator 210 (e.g., a CPU) and the control circuit 201. The internal command generator 210 may generate the command(s) CMD in response to the request REQ received from the host 50 and may variously provide the command(s) CMD to one or more of the neuromorphic core dies 300a to 300d through corresponding conducting elements 220 (e.g., first through silicon vias TSV_C and second through silicon vias TSV_D). In certain exemplary embodiments various conducting elements (or portions of conducting elements) may be exclusive provided (or independently formed) for one or more of the neuromorphic core dies 300a to 300d.

The control circuit 201 may be used to store the weights WDT in the neuromorphic core dies 300a to 300d, provide the input data IDT to the neuromorphic core dies 300a to 300d, and receive the final data DTA from the neuromorphic core dies 300a to 300d.

The neuromorphic core dies 300a to 300d may respectively include control logic circuits 311a to 311d that may be used to provide internal control signals to control a synapse array in response to a decoding of the commands CMD. The neuromorphic core dies 300a to 300d may also respectively include data processors 313a to 313d that may be used to perform various processing operation(s) (e.g., read and write operations) based on the internal control signals and the stored weights WDT.

Thus, the input data IDTA and the weights WDT may be provided to one or more of the neuromorphic core dies 300a to 300d through the conducting elements 220 (e.g., TSV_C and/or TSV TSV_D). And final data DTA retrieved from at least one of the neuromorphic core dies 300a to 300d may be provided to at least another one of the neuromorphic core die 300a to 300d, or to the control circuit 201 through the conducting elements 220 (e.g., TSV_C and/or TSV TSV_D).

Figure 4:
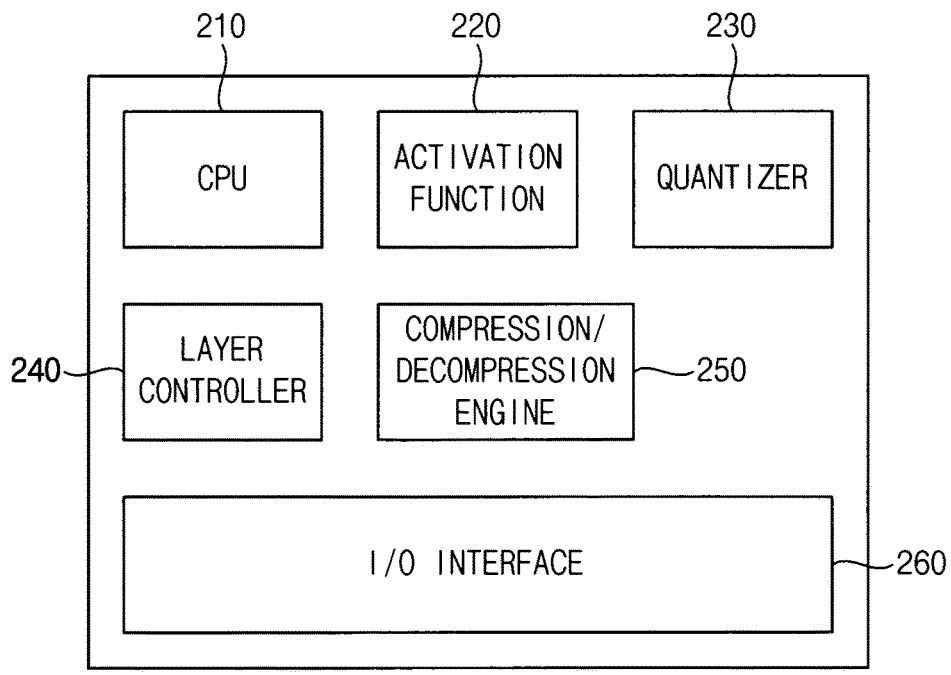
FIGS. 4 and 5 are respective block diagrams illustrating examples of the control circuit in the stacked neuromorphic device of FIG. 3 according to exemplary embodiments.

FIG. 4 is a block diagram illustrating an example (201a) of the control circuit 201 in the stacked neuromorphic device 90a of FIG. 3 according to exemplary embodiments.

Referring to FIG. 4, the control circuit 201a may include a central processing unit (CPU) 210, an activation function 220, a quantizer 230, a layer controller 240, a compression/decompression engine 250 and an input/output (I/O) interface 260.

The control circuit 201a may correspond to an example of the control circuit 201 when a synapse array included in each of the neuromorphic core dies 300a to 300d performs multiplication operation(s) for the weights and the input data, and thereafter performs an accumulation operation for the result(s) of the multiplication operation(s).

The CPU 210 may control the overall operation of the control circuit 201a. The activation function 220 may perform an activation operation on the result(s) of the multiplication operation(s) provided from the synapse array.

The quantizer 230 may quantize the weights and the input data to generate quantized weights and quantized input data, and provide the quantized weights and the quantized input data to the neuromorphic core dies 300a to 300d. In exemplary embodiments, the quantizer 230 may quantize the input data with a fixed point type into input data with fixed point type having less bits and may quantize the weights with a floating point type into weights with a fixed point type.

The layer controller 240 may control data transmission(s) among the neuromorphic core dies 300a to 300d. The compression/decompression engine 250 may perform decompression on the data provided from the host 50 and perform compression on the data to be provided to the host 50.

The I/O interface 260 may facilitate the use of one or more communication/formatting protocols allowing interfacing between the host 50 and the logic die 200.

In exemplary embodiments, the activation function 220 and the I/O interface 260 may be implemented using a field programmable gate array (FPGA) together with the CPU 210, and the quantizer 230, layer controller 240 and compression/decompression engine 250 may be implemented using an application specific integrated circuit (ASIC).

Figure 5:
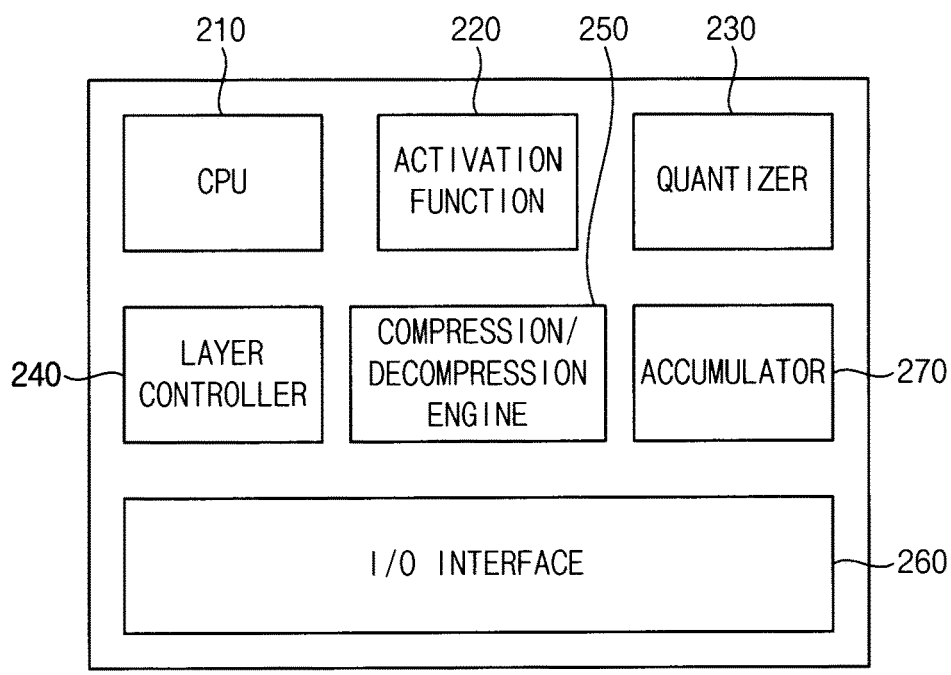

FIG. 5 is a block diagram illustrating another example (201b) of the control circuit 201 in the stacked neuromorphic device 90a of FIG. 3 according to exemplary embodiments.

Referring to FIG. 5, the control circuit 201b may again include the CPU 210, the activation function 220, the quantizer 230, the layer controller 240, the compression/decompression engine 250, and the I/O interface 260—together with an accumulator 270. Thus, the control circuit 201b corresponds in large part to the control circuit 201a of FIG. 4, except for the further provision of the accumulator 270 which may be used to perform an accumulation operation on (e.g.,) the result(s) of the multiplication operation(s) performed by the neuromorphic core dies 300a to 300d and provide an accumulated result to the activation function 220.

Figure 6:
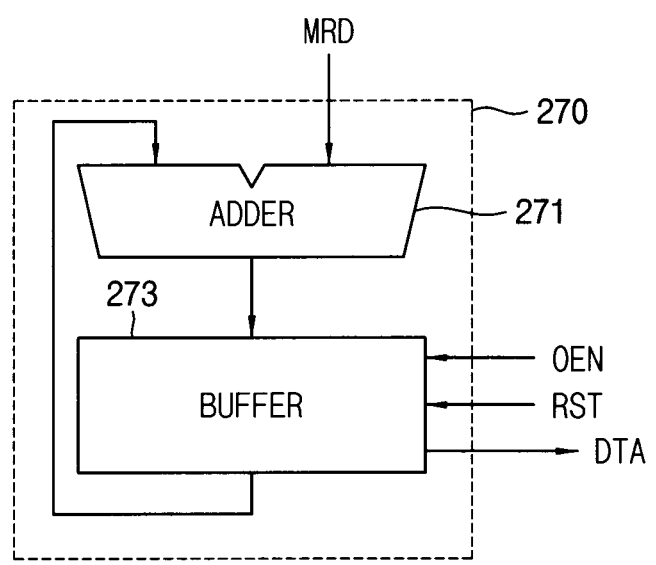
FIG. 6 is a block diagram further illustrating an example of the accumulator of FIG. 5 according to exemplary embodiments.

FIG. 6 is a block diagram illustrating one example of the accumulator 270 of FIG. 5 according to exemplary embodiments.

Referring to FIG. 6, the accumulator 270 may include an adder 271 and a buffer 273. With this configuration, for example, the accumulator 270 may be used to generate the accumulated result (e.g., the final data DTA obtained from the multiplication result data MRD corresponding to the results of the multiplication operations performed by the neuromorphic core dies 300a to 300d).

Here, the adder 271 may have a first input terminal and a second input terminal, and may receive the multiplication result data MRD as a first input. The adder 271 may add the multiplication result data MRD with an output of the buffer 273 received at the second input terminal to provide an added result to the buffer 273.

The buffer 273 may provide the output of the adder 271 as the final data DTA in response to an output enable signal OEN and may be reset in response to a reset signal RST. The output enable signal OEN and the reset signal RST may be provided from the CPU 210.

Figure 7:
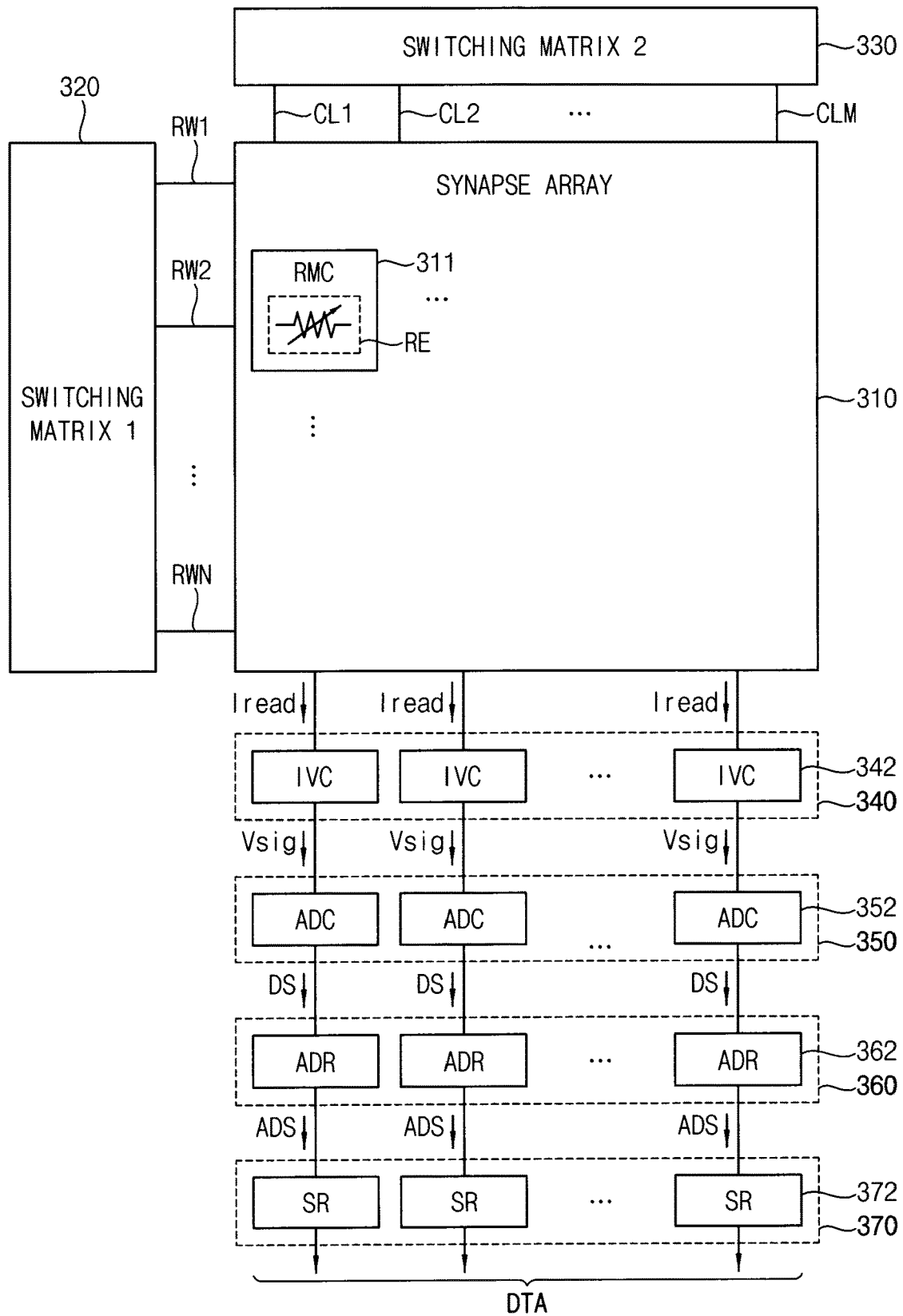
FIG. 7 is a block diagram illustrating an example of a neuromorphic core die in the stacked neuromorphic device of FIG. 2 according to exemplary embodiments.

FIG. 7 is a block diagram illustrating one example (301) of the neuromorphic core dies 300a to 300d in the stacked neuromorphic device 90 of FIG. 2 according to exemplary embodiments.

Referring to FIG. 7, the neuromorphic core die 301 may include a synapse array 310 and an analog-to-digital conversion block 350. The neuromorphic core die 301 may be referred to as a neuromorphic computing chip. The neuromorphic core die 301 may further include a first switching matrix 320, a second switching matrix 330, a current-to-voltage conversion block 340, an adder block 360 and a shift register block 370.

The synapse array 310 includes a plurality of resistive memory cells RMC arranged in a matrix. Each of the plurality of resistive memory cells RMC includes a resistive element RE, and each of the plurality of resistive memory cells RMC may correspond to a synapse 311.

Each of the plurality of resistive memory cells RMC may be connected to a respective one of a plurality of row lines RW1, RW2, . . . , RWN and a respective one of a plurality of column lines CL1, CL2, . . . , CLM, where 'N' and 'M' are respective natural number(s) greater than one. A more detailed possible configuration of the synapse array 310 will be described hereafter with reference to FIGS. 9A and 9B.

The synapse array 310 may be used to store data (e.g., weights). For example, the data may be stored in the plurality of resistive memory cells RMC by using a resistance change of the resistive element RE included in each of the plurality of resistive memory cells RMC. The synapse array 310 generates a plurality of read currents Iread corresponding to a plurality of signal voltages Vsig based on a plurality of input voltages and the stored data. For example, the plurality of input voltages may be provided to the synapse array 310 through the plurality of row lines RW1, RW2, . . . , RWN.

Figure 8A:
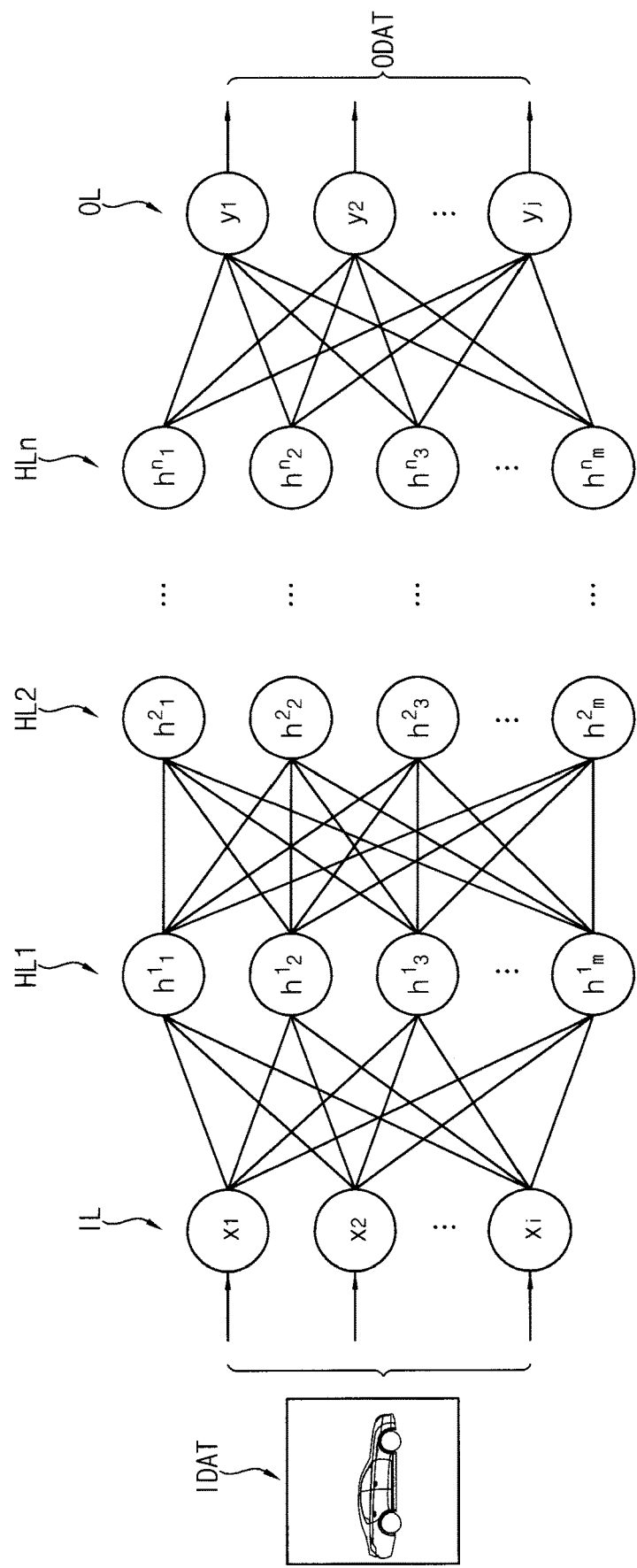
FIGS. 8A and 8B are conceptual diagrams illustrating an example of a neural network system driven by a neuromorphic core die according to exemplary embodiments.
Figure 8B:
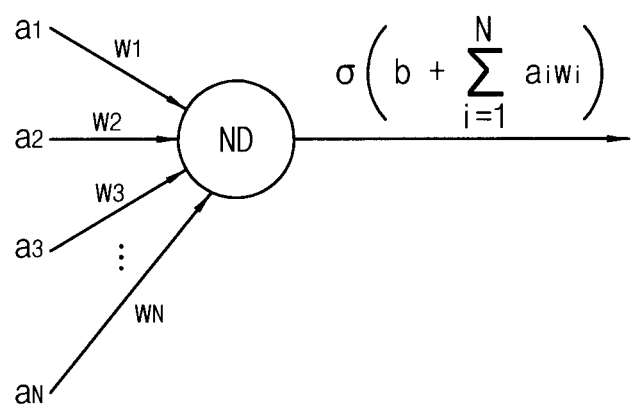

In some exemplary embodiments, like the ones described hereafter with reference to FIGS. 8A and 8B, the neuromorphic core die 301 may be used to drive one or more neural network systems and/or machine learning systems (e.g., an artificial neural network (ANN) system, a convolutional neural network (CNN) system, a deep neural network (DNN) system, a deep learning system, etc.).

For example, at least one of various services and/or applications (e.g., an image classify service, a biometric user authentication service, an advanced driver assistance system (ADAS) service, a voice assistant service, an automatic speech recognition (ASR) service, etc.) may be performed, executed and/or processed using the neuromorphic core die 301. Here, the data stored in the synapse array 310 may correspond to a plurality of weights include in a plurality of layers of a neural network system, and the plurality of read currents Iread and the plurality of signal voltages Vsig may represent a result of multiplication and accumulation operations performed by the neural network system. In other words, the synapse array 310 may perform a data storage operation and a data computation (or calculation) operation. This approach will be described hereafter in some additional detail with reference to FIG. 9B.

The first switching matrix 320 may be connected to the plurality of row lines RW1, RW2, . . . , RWN of the synapse array 310. The first switching matrix 320 may drive the plurality of row lines RW1, RW2, . . . , RWN in response to row selection signals for selecting at least one of the plurality of row lines RW1, RW2, . . . , RWN and/or row driving voltages for driving at least one of the plurality of row lines RW1, RW2, . . . , RWN.

The second switching matrix 330 may be connected to the plurality of column lines CL1, CL2, . . . , CLM of the synapse array 310. The second switching matrix 130 may drive the plurality of column lines CL1, CL2, . . . , CLM in response to column selection signals for selecting at least one of the plurality of column lines CL1, CL2, . . . , CLM and/or column driving voltages for driving at least one of the plurality of column lines CL1, CL2, . . . , CLM.

The current-to-voltage conversion block 340 may include a plurality of current-to-voltage converters (IVCs) 342. The plurality of current-to-voltage converters 342 may be used to convert the plurality of read currents Iread into the plurality of signal voltages Vsig. For example, each of the plurality of current-to-voltage converters 342 may include a current mirror.

The analog-to-digital conversion block 350 includes a plurality of analog-to-digital converters (ADCs) 352. The plurality of analog-to-digital converters 352 may be used to convert the plurality of signal voltages Vsig into a plurality of digital signals DS.

The adder block 360 may include a plurality of adders (ADRs) 362. The plurality of adders 362 may be used to sum the plurality of digital signals DS to generate a plurality of summed digital signals ADS.

The shift register block 370 may include a plurality of shift registers (SRs) 372. The plurality of shift registers 372 may be used to generate final data DTA based on an output of the plurality of adders 362 (e.g., based on the plurality of summed digital signals ADS). The final data DTA may correspond to a final result of the multiplication and accumulation operations performed by the neural network system.

In the illustrated exemplary embodiment of FIG. 7, the number of the plurality of current-to-voltage converters 342, the number of the plurality of analog-to-digital converters 352, the number of the plurality of adders 362 and the number of the plurality of shift registers 372 may be substantially the same as the number of the plurality of columns CL1, CL2, . . . , CLM of the synapse array 310.

Although not illustrated in FIG. 7, the neuromorphic core die 301 may further include a timing controller or a control logic circuit (see, e.g., element 311a of FIG. 3) that may be used to generate various control signals controlling operation timings of the first switching matrix 320, the second switching matrix 330, the current-to-voltage conversion block 340, the analog-to-digital conversion block 350, the adder block 360, the shift register block 370, etc., and/or may further include a voltage regulator that generates the row driving voltages, the column driving voltages, the reference voltage, etc.

Typically, the plurality of resistive memory cells RMC included in the synapse array 310 have a temperature and/or time performance dependency. For example, the resistive element RE included in each of the plurality of resistive memory cells RMC may have a temperature dependency wherein resistance decreases as temperature increases, or resistance increases as temperature decreases. In addition, the resistive element RE may have a time dependency including a data retention characteristic in which resistance decreases as time passes, a drift characteristic in which the resistance increases over a predetermined period of time (e.g., a n executed number of write operations). Thus, the level of the read current Iread provided by the synapse array 310 may change with temperature and/or change over time. To store accurate data and perform computation(s) or calculation(s) without error, it is necessary to reduce or eliminate such temperature and time dependencies.

Referring to FIG. 7, the neuromorphic core die 301 may include the analog-to-digital converter 352 that includes the at least one resistive memory element RME including the same resistive material as the resistive element RE included in the synapse array 310. In the neuromorphic core die 301, the read current Iread output from the synapse array 310, the signal voltage Vsig corresponding to the read current Iread and the voltage used in the analog-to-digital converter 352 may have the same temperature dependency and/or the same time dependency. Thus, when the output of the synapse array 310 is analog-to-digital converted, the resulting, constant digital signal DS will not vary with temperature or over time. Accordingly, the analog-to-digital conversion and the data computation may be accurately and efficiently performed.

FIGS. 8A and 8B are respective diagrams describing an example of a neural network system that may be driven by a neuromorphic core die according to exemplary embodiments.

Referring to FIG. 8A, a general neural network may include an input layer IL, a plurality of hidden layers HL1, HL2, ..., HLn and an output layer OL.

The input layer IL may include i input nodes $x_1, x_2, \ldots, x_i$, where 'i' is a natural number. Input data (e.g., vector input data) IDAT whose length is 'i' may be input to the input nodes $x_1, x_2, \ldots, x_i$ such that each element of the input data IDAT is input to a respective one of the input nodes $x_1, x_2, \ldots, x_i$.

The plurality of hidden layers HL1, HL2, ..., HLn may include n hidden layers, where n is a natural number, and may include a plurality of hidden nodes $h^1_1, h^1_2, h^1_3, \ldots, h^1_m, h^2_1, h^2_2, h^2_3, \ldots, h^2_m, h^n_1, h^n_2, h^n_3, \ldots, h^n_m$. For example, the hidden layer HL1 may include m hidden nodes $h^1_1, h^1_2, h^1_3, \ldots, h^1_m$, the hidden layer HL2 may include m hidden nodes $h^2_1, h^2_2, h^2_3, \ldots h^2_m$, and the hidden layer HLn may include m hidden nodes $h^n_1, h^n_2, h^n_3, \ldots, h^n_m$, where 'm' is a natural number.

The output layer OL may include j output nodes $y_1, y_2, \ldots, y_j$, where 'j' is a natural number. Each of the output nodes $y_1, y_2, \ldots, y_j$ may correspond to a respective one of classes to be categorized. The output layer OL may output output values (e.g., class scores or simply scores) or output data ODAT associated with the input data IDAT for each of the classes. The output layer OL may be referred to as a fully-connected layer and may indicate, for example, a probability that the input data IDAT corresponds to a car.

A structure of the neural network illustrated in FIG. 8A may be represented by information on branches (or connections) between nodes illustrated as lines, and a weighted value assigned to each branch, which is not illustrated. Nodes within one layer may not be connected to one another, but nodes of different layers may be fully or partially connected to one another.

Each node (e.g., the node $h^1_1$) may receive an output of a previous node (e.g., the node $x_1$), may perform a computing operation, computation or calculation on the received output, and may output a result of the computing operation, computation and/or calculation as an output to a next node (e.g., the node $h^2_1$). Each node may calculate a value to be output by applying the input to a specific function (e.g., a nonlinear function).

Generally, the structure of the neural network is set in advance, and the weighted values for the connections between the nodes are set appropriately using already known data. Such already known data may be referred to as "training data," and a process of determining the weighted value is referred to as "training." The neural network "learns" during the training process. A group of an independently trainable structure and the weighted value is referred to as a "model," and a process of predicting, by the model with the determined weighted value, which class the input data belongs to, and then outputting the predicted value, is referred to as a "testing" process.

Referring to FIG. 8B, an example of an operation performed by one node ND included in the neural network of FIG. 8A is illustrated in some additional detail.

When N inputs $a_1, a_2, a_3, \ldots, a_N$ are provided to the node ND, the node ND may multiply the N inputs $a_1, a_2, a_3, \ldots, a_N$ and corresponding N weights $w_1, w_2, w_3, \ldots, w_N$, respectively, may sums N values obtained by the multiplication, may add an offset "b" to a summed value, and may generate one output value (e.g., "z") by applying a value to which the offset "b" is added to a specific function "σ".

When one layer included in the neural network illustrated in FIG. 2A includes M nodes ND illustrated in FIG. 2B, output values of the one layer may be obtained by the following:

$$W*A=Z \qquad \text{[Equation 1]},$$

where "W" represents weights for all connections included in the one layer, and may be implemented in an M*N matrix, "A" represents the N inputs $a_1, a_2, a_3, \ldots, a_N$ received by the one layer, and may be implemented in an N*1 matrix form, and "Z" represents M outputs $z_1, z_2, z_3, \ldots, z_M$ output from the one layer, and may be implemented in an M*1 matrix form.

Figure 9A:
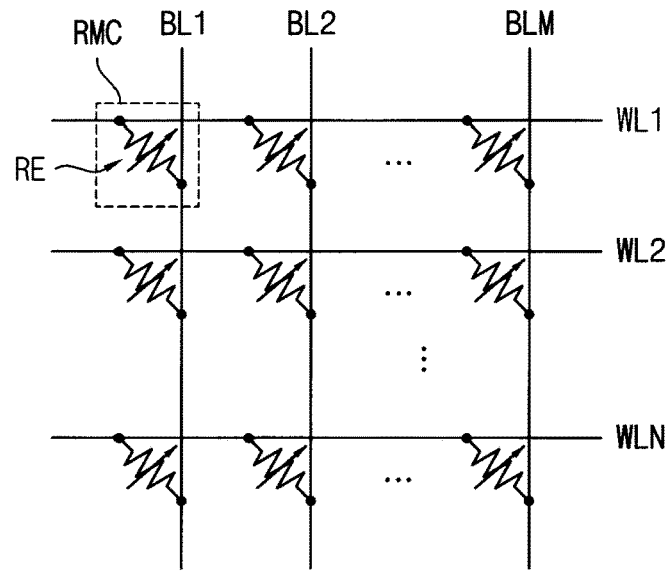
FIGS. 9A and 9B are circuit diagrams illustrating examples of a synapse array included in the neuromorphic core die of FIG. 7 according to exemplary embodiments.
Figure 9B:
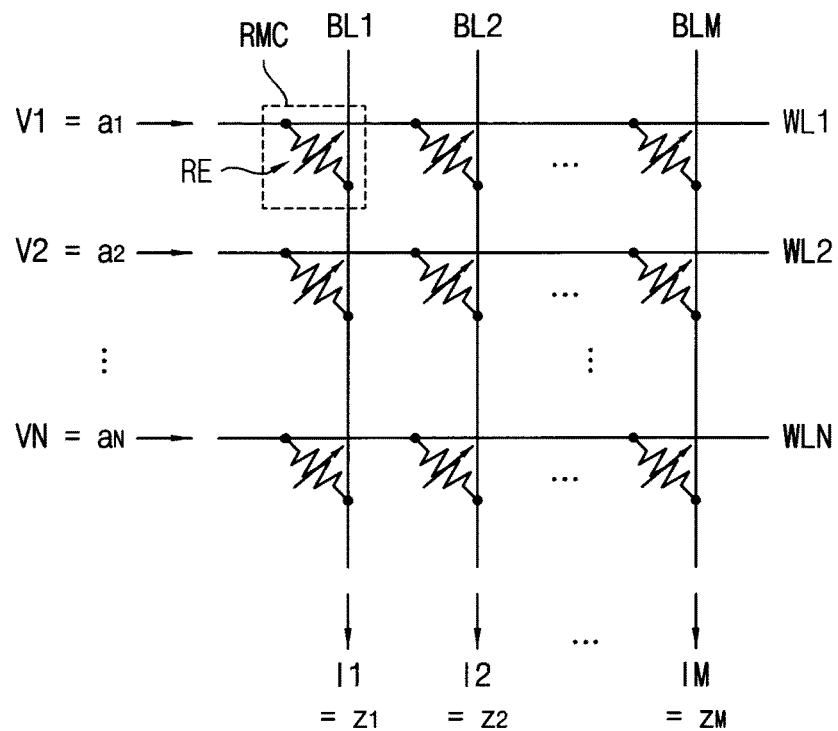

FIGS. 9A and 9B are respective diagrams illustrating examples of a synapse array included in the neuromorphic core die in FIG. 7 according to exemplary embodiments.

Referring to FIG. 9A, a synapse array 310a includes a plurality of wordlines WL1, WL2, ..., WLN, a plurality of bitlines BL1, BL2, ..., BLM, and a plurality of resistive memory cells RMC.

The plurality of wordlines WL1, WL2, ..., WLN in FIG. 9A may correspond to the plurality of row lines RW1, RW2, ..., RWN in FIG. 1, the plurality of bitlines BL1, BL2, BLM in FIG. 9A may correspond to the plurality of column lines CL1, CL2, ..., CLM in FIG. 1, and the plurality of resistive memory cells RMC in FIG. 9A may correspond to the plurality of resistive memory cells RMC in FIG. 7. Each of the plurality of resistive memory cells RMC may include a resistive element RE, and may be connected to a respective one of the plurality of wordlines WL1, WL2, ..., WLN and a respective one of the plurality of bitlines BL1, BL2, ..., BLM.

A resistance of the resistive element RE may vary in response to a write voltage applied through the plurality of wordlines WL1, WL2, ..., WLN or the plurality of bitlines BL1, BL2, ..., BLM, and the plurality of resistive memory cells RMC may store a plurality of data by the resistance change of the resistive element RE. For example, when the write voltage is applied to a selected wordline and a ground voltage (e.g., about 0V) is applied to a selected bitline, a data value of '1' may be written to a selected resistive memory cell. When the ground voltage is applied to the selected wordline and the write voltage is applied to the selected bitline, a data value of '0' may be written to the selected resistive memory cell. Further, when a read voltage is applied to the selected wordline and the ground voltage is applied to the selected bitline, data written in the selected resistive memory cell may be read or retrieved.

In some exemplary embodiments, each of the plurality of resistive memory cells RMC may be one of a number of different types of resistive memory cells (e.g., a phase change random access memory (PRAM) cell, a resistance random access memory (RRAM) cell, a magnetic random access memory (MRAM) cell, a ferroelectric random access memory (FRAM) cell, etc.).

In some exemplary embodiments, the resistive element RE may include a phase change material that changes its crystalline state in response to an amount of an applied current. In other exemplary embodiments, the resistive element RE may include a perovskite compound, a transition metal oxide, a magnetic material, a ferromagnetic material, or an anti-ferromagnetic material, instead of the phase change material. However, the materials included in the resistive element RE are not limited thereto.

Referring to FIG. 9B, an example in which the synapse array 310a of FIG. 9A performs the calculation described with reference to FIGS. 8A and 8B is illustrated.

Each resistive memory cell RMC may correspond to one synapse or connection in the neural network system and may store one weight. Thus, M*N data stored in the synapse array 310a may correspond to a weight matrix that includes the weights included in the one layer described with reference to FIGS. 8A and 8B. In other words, the M*N data may correspond to "W" that is implemented by the M-by-N matrix of Equation 1.

N input voltages V1, V2, . . . , VN applied through the plurality of wordlines WL1, WL2, . . . , WLN may correspond to an input matrix that includes the N inputs $a_1, a_2, a_3, \ldots, a_N$ received by the one layer described with reference to FIGS. 8A and 8B. That is, the N input voltages V1, V2, . . . , VN may correspond to "A" that is implemented in the N*1 matrix of Equation 1.

M read currents I1, I2, . . . , IM output through the plurality of bitlines BL1, BL2, . . . , BLM are M may correspond to an output matrix that includes the M outputs $z_1, z_2, z_3, \ldots, z_M$ output from the one layer described with reference to FIGS. 8A and 8B. That is, the M read currents I1, I2, . . . , IM may correspond to "Z" that is implemented in the M*1 matrix of Equation 1.

Hence, when the synapse array 310a is implemented by storing the plurality of weights having a matrix form in the plurality of resistive memory cells RMC, and when the input voltages V1, V2, . . . , VN corresponding to the plurality of inputs are provided through the plurality of wordlines WL1, WL2, . . . , WLN, the read currents I1, I2, . . . , IM output through the plurality of bitlines BL1, BL2, . . . , BLM may correspond to the result of the multiplication and accumulation operations performed by the neural network system. By implementing the plurality of layers in the neural network system in this manner, the neuromorphic computing chip that performs the data storage and computation (or calculation) operations may be provided.

Although the crossbar array 310a having a two-dimensional (2D) array structure are illustrated in FIGS. 9A and 9B, exemplary embodiments are not limited thereto, and a synapse array may be formed in a three-dimensional (3D) or vertical array structure. In addition, a configuration of the resistive memory cells RMC may be changed according to exemplary embodiments.

Figure 10:
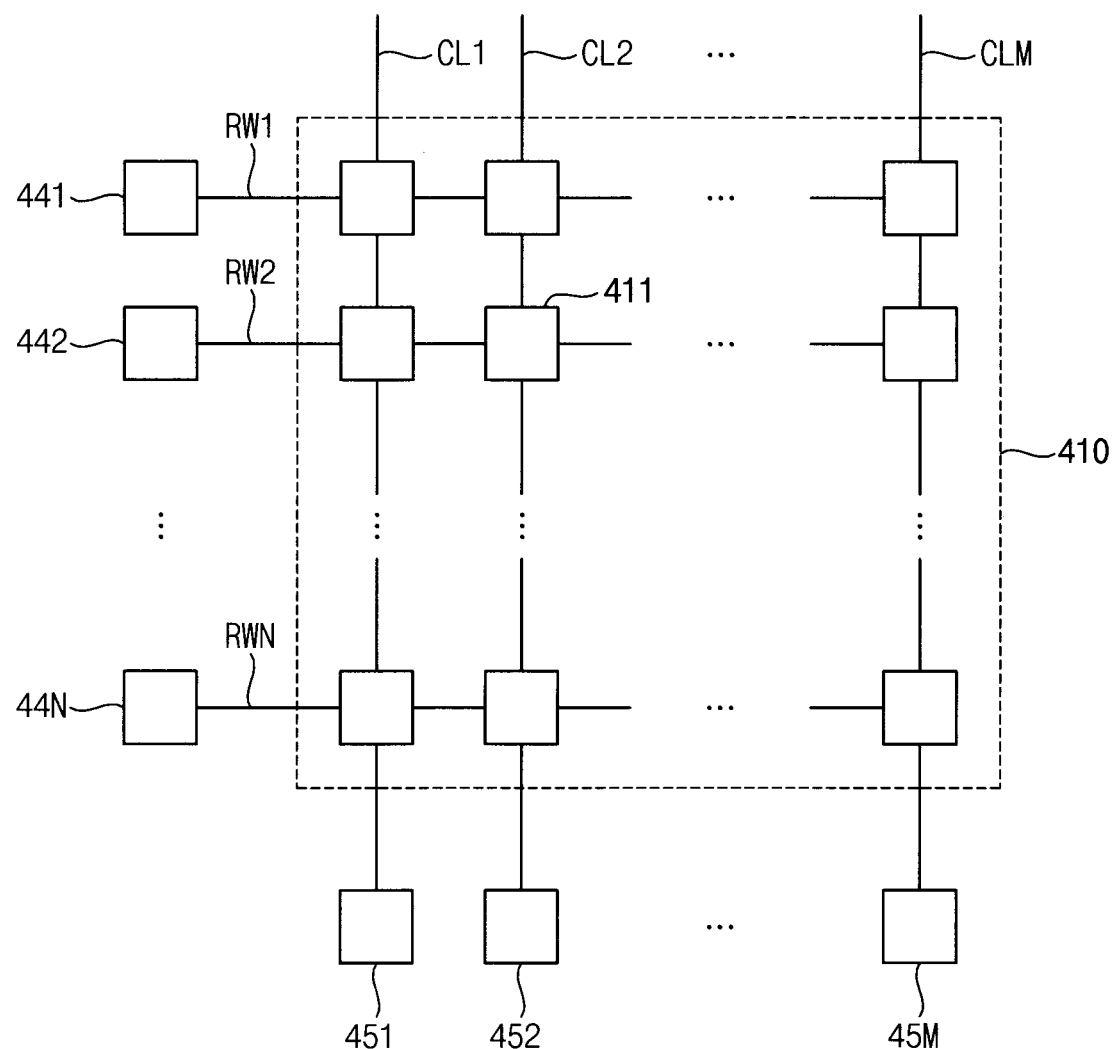
FIG. 10 is a block diagram illustrating a neuromorphic core die in the stacked neuromorphic device of FIG. 2 according to exemplary embodiments.

FIG. 10 is a block diagram illustrating another example (401) of the neuromorphic core dies 300a to 300d in the stacked neuromorphic device 90 of FIG. 2 according to exemplary embodiments.

Referring to FIG. 10, the neuromorphic core die 401 may include a synapse array 410, a plurality of first neurons 441, 442, . . . , 44N and a plurality of second neurons 451, 452, . . . , 45M. Each of the first neurons 441, 442, . . . , 44N may be referred to as a pre-synaptic neuron and each of the second neurons 451, 452, . . . , 45M may be referred to as a post-synaptic neuron.

The synapse array 410 includes a plurality of synapses 411, the synapse array 410 are connected to the first neurons 441, 442, . . . , 44N through a plurality of row lines RW1, RW2, . . . , RWN and the synapse array 410 are connected to the second neurons 451, 452, . . . , 45M through a plurality of column lines CL1, CL2, . . . , CLM.

The synapse array 410 may store weights included in a plurality of layers of a neural network system and may perform calculation based on the weights and the input data.

Figure 11:
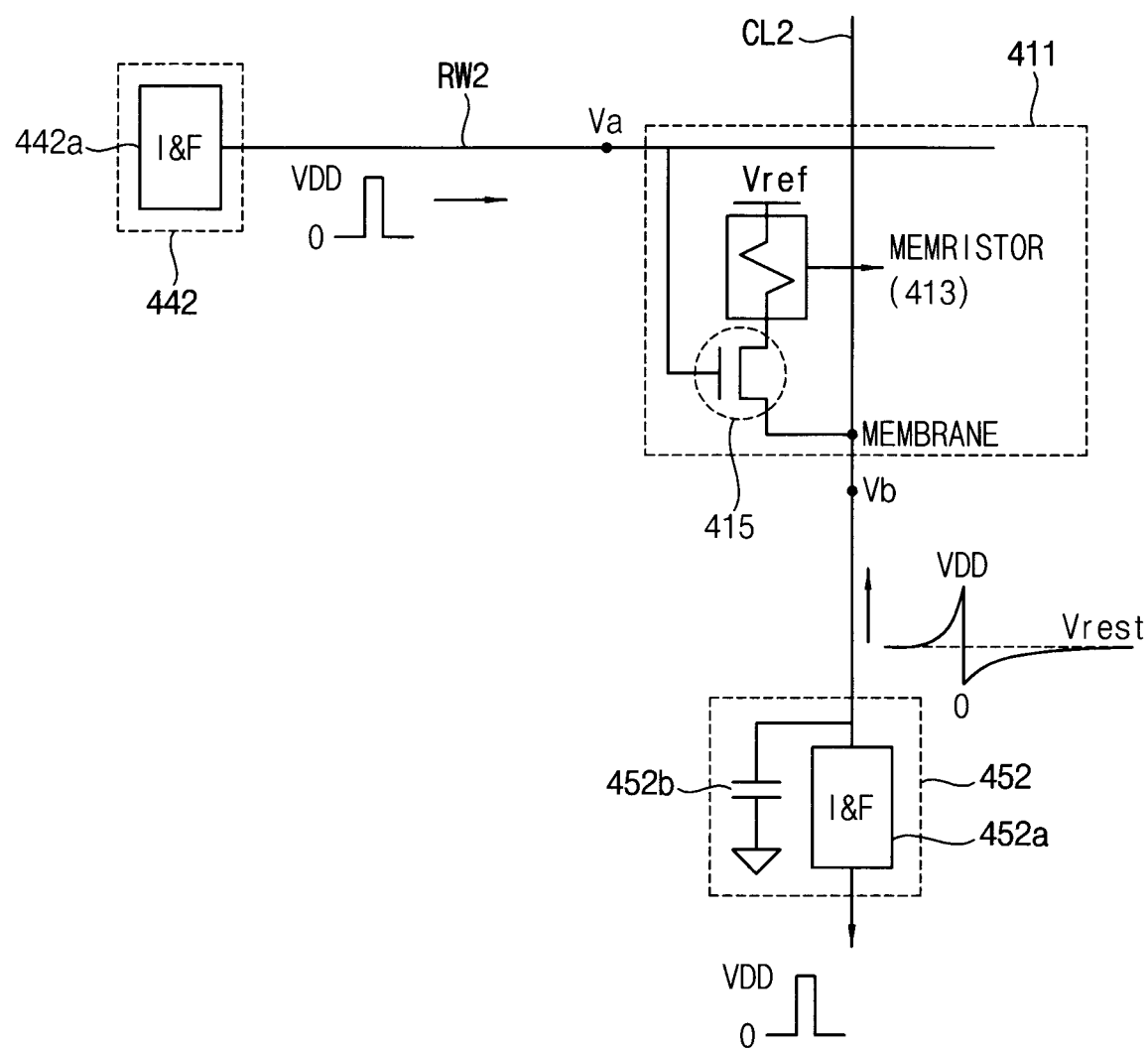
FIG. 11 is a conceptual diagram illustrates relationships between synapses, a corresponding first neuron and a corresponding second neuron of FIG. 10 according to exemplary embodiments.

FIG. 11 is a diagram further illustrating certain exemplary relationships for synapses according to exemplary embodiments.

Here, a synapse 411 and a first neuron 442 are connected via the row line RW2. The synapse 411 and a second neuron 452 are connected via the column line CL2.

The synapse 411 includes a memristor 413 having a changeable resistance value (e.g., a resistance value that may be changed under defined conditions). The synapse 411 also includes a transistor 415 connected to the memristor 413. The transistor 415 receives at least two input signals. The resistance value of the memristor 413 may be changed based on a difference in input time of the at least two input signals that are applied to the transistor 415.

For example, the resistance value of the memristor 413 may be changed according to a voltage change due to the input time difference of the input signals. For example, the resistance value of the memristor 413 may be changed according to a voltage change due to an input time difference between a first input signal and a second input signal. The first input signal may be a signal applied to a gate terminal of the transistor 415. The second input signal may be a signal based on a membrane voltage applied to a source terminal of the transistor 415. The first input signal may be transmitted from the first neuron 442, and the second input signal may be transmitted from the second neuron circuit 452.

A direction of the current flowing on the memristor 413 may be determined based on a difference in voltage caused by the input time difference between the first input signal and the second input signal. For example, in response to the first input signal being input to the transistor 415 earlier than the second input signal, the current may flow in a direction from the transistor 415 to the memristor 413. When the input signal is input to the transistor 415 later than the second input signal, conversely, the current may flow in a direction from memristor 413 to the transistor 415.

The direction and amount of the current flowing on the memristor 413 may be determined based on the voltage difference caused by the input time difference between the first input signal and the second input signal. For example, in response to the time difference between the first input signal and the second signal being sufficiently large such that the first input signal and the second input signal hardly influence each other, the transistor 415 is in an ON state during input of the first input signal and Vref>Vrest is satisfied. Therefore, the current flows in the direction from the memristor 413 to the transistor 415. In this case, since a voltage difference Vref−Vrest between opposite ends of the memristor 413 is smaller than a threshold voltage for changing characteristics of the memristor 413, the memristor 413 may stay in a high resistance state (HRS) and only a minor current of approximately zero flows on the memristor 413.

In the event that the input time difference between the first input signal and the second input signal is relatively small such that the input signals may influence each other, and in the event that the first input signal is input a bit earlier than the second input signal, the transistor 415 may be in the ON state during input of the first input signal, and a voltage Vb of a source of the transistor 415 satisfies Vb>Vref. Therefore, the current flows in the direction from the transistor 415 to the memristor 413. Here, in the event that the voltage difference Vb−Vref between the opposite ends of the memristor 413 is larger than the threshold voltage for changing characteristics of the memristor 413, the memristor 413 may stay in a low resistance state (LRS). When the memristor 413 is in the LRS, a relatively large amount of current may flow on the memristor 413, otherwise, the memristor 413 may stay in the HRS.

In the event that the input time difference between the first input signal and the second input signal is relatively small such that the input signals may influence each other, and in the event that the first input signal is input similar to or a bit later than the second input signal, the transistor 415 may be in the ON state during input of the first signal, and the voltage Vb of the source of the transistor 415 satisfies Vb<Vref. The current may flow in the direction from the memristor 413 to the transistor 415. In the event that the voltage difference Vref−Vb between the opposite ends of the memristor 413 is larger than the threshold voltage for changing characteristics of the memristor 413, the memristor 413 may stay in the HRS. In this case, a relatively small amount of current flows in the memristor 413, otherwise, the memristor 413 may still stay in the LRS.

In the event that the first input signal is provided much later than the second input signal, the input time difference is increased. Therefore, the input signal may not influence each other. In addition, since Vref>Vrest is satisfied, the current may flow in the direction from the memristor 413 to the transistor 415. Because the voltage difference Vref−Vrest between the opposite ends of the memristor 413 is smaller than the threshold voltage for changing characteristics of the memristor 4113, the memristor 413 may stay in the HRS.

One end of the memristor 413 may be connected to a drain terminal of the transistor 415 while the other end is connected to a voltage source to apply a reference voltage Vref. A channel of the memristor 413 may be serially connected to a channel of the transistor 415. Different voltages may be applied to the memristor 413 and the source terminal of the transistor 415. The transistor 415 connected to the memristor 413 may be an n-channel metal-oxide semiconductor (NMOS) transistor.

In FIG. 11, the synapse 411 may further include a first terminal connected to the gate terminal of the transistor 415 to provide the first input signal, and a second terminal connected to the source terminal of the transistor 415 to provide the second input signal. The synapse 411 may be connected to the first neuron 442 through the first terminal, and may be connected to the second neuron 454 through the second terminal. A first voltage Va may be supplied from the first neuron 442 through the first terminal. A second voltage Vb may be supplied from the second neuron 454 through the second terminal.

For example, the first neuron 442 and the second neuron 454 may each include an integrate-and-fire (I&F) neurons 442a and 452a for firing a spike or a pulse. The first neuron 442 and the second neuron 454 may fire the spike or the pulse in response to an amount of a current received through the synapse 411 exceeding a predetermined threshold.

The second neuron 452 may generate a spike that fires with reference to the resting voltage Vrest. The second neuron 452 may further include a capacitor 452b.

Thus, the configuration illustrated by FIG. 11 may be operationally used in conjunction with spike-timing dependent plasticity (STDP).

Figure 12:
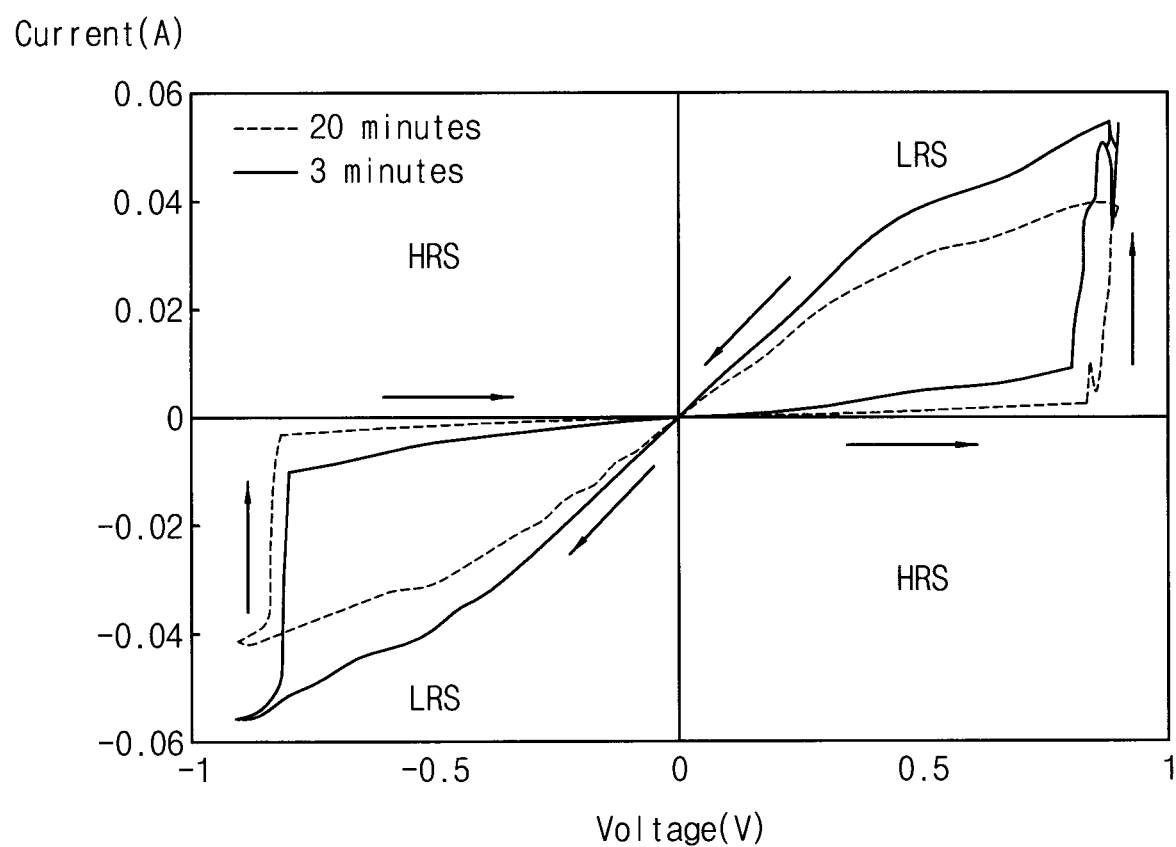
FIG. 12 is a graph illustrating an example of operational characteristics of the memristor included in the synapse of FIG. 11.

FIG. 12 is a graph illustrating exemplary operational characteristics for a memristor like the one assumed in the description provided in relation to FIG. 11.

According to the operational characteristics of the memristor illustrated in FIG. 12, the memristor refers to a passive device capable of remembering an amount of a current that has been passed. The memristor remembers a charge amount and a resistance of the memristor may be changed according to the charge amount. That is, the resistance of the memristor may be changed according to a flow and amount of current.

Referring to a graph of FIG. 12, it is demonstrated that almost no current flows when a voltage supplied to the memristor does not reach about ±8V. However, in response to the supplied voltage exceeding about ±8V, the amount of current flowing on the memristor suddenly increases. A voltage of a spot at which the current amount suddenly changes may be understood as a threshold voltage, which corresponds to ±8V in FIG. 12.

The state in which the voltage supplied to the memristor does not reach the threshold voltage and therefore almost no current flows may be referred to as the HRS. The state in which the voltage supplied to the memristor exceeds the threshold voltage and therefore the current amount is suddenly increased may be referred to as the LRS.

Figure 13:
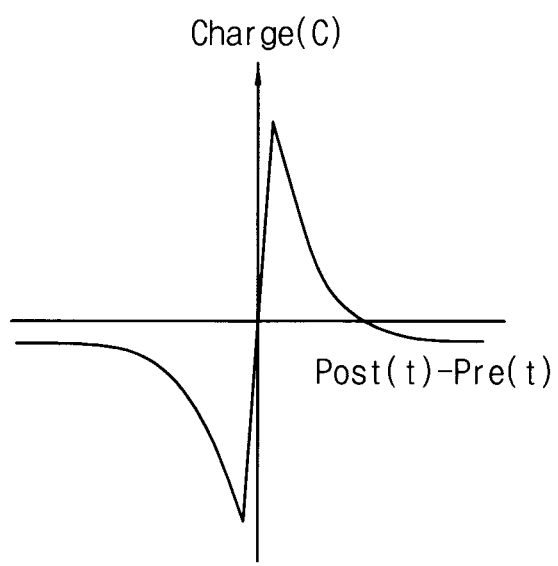
FIGS. 13 and 14 are respective graphs illustrating a change in the amount of current flowing between the first neuron and the second neuron, and illustrating relationships between a spike generation time difference in general STDP operation and variations of a synaptic weight.
Figure 14:
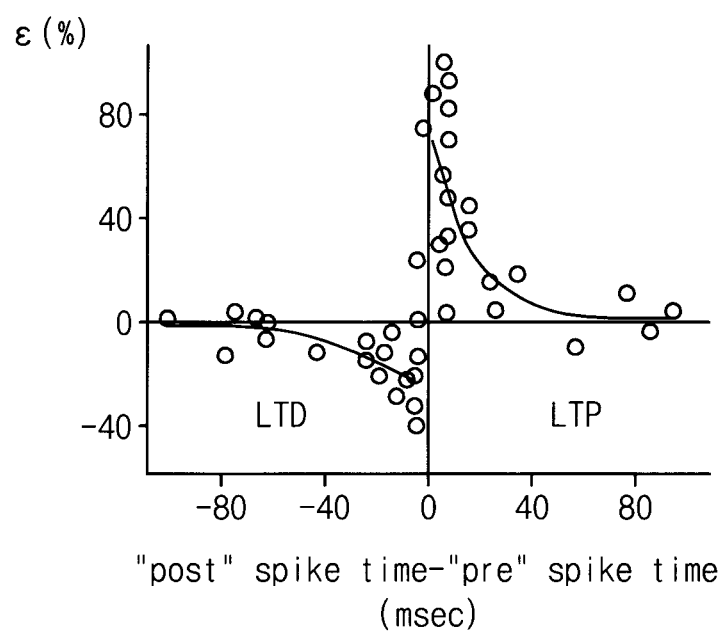

FIG. 13 is a graph illustrating a change in the amount of current flowing between the first neuron and the second neuron and FIG. 14 is a graph illustrating relationships between a spike generation time difference in general STDP operation and variations of a synaptic weight.

The generation of the post-synaptic spike and the pre-synaptic pulse and the characteristics of the current flowing during the generation are illustrated in FIG. 13. The relationships between a pulse generation time difference in the STDP operation and the variations of the synaptic weight show characteristics very similar to a graph of FIG. 14.

When the spike fired in the foregoing neuron circuits is modeled into an electrical waveform, the synaptic weight variations may be expressed by a subtraction between a waveform related to the pulse fired in the pre-synaptic neuron circuit (hereinafter, referred to as 'pre-synaptic pulse') and a waveform related to the spike fired in the post-synaptic neuron circuit (hereinafter, referred to as 'post-synaptic spike').

Figure 15:
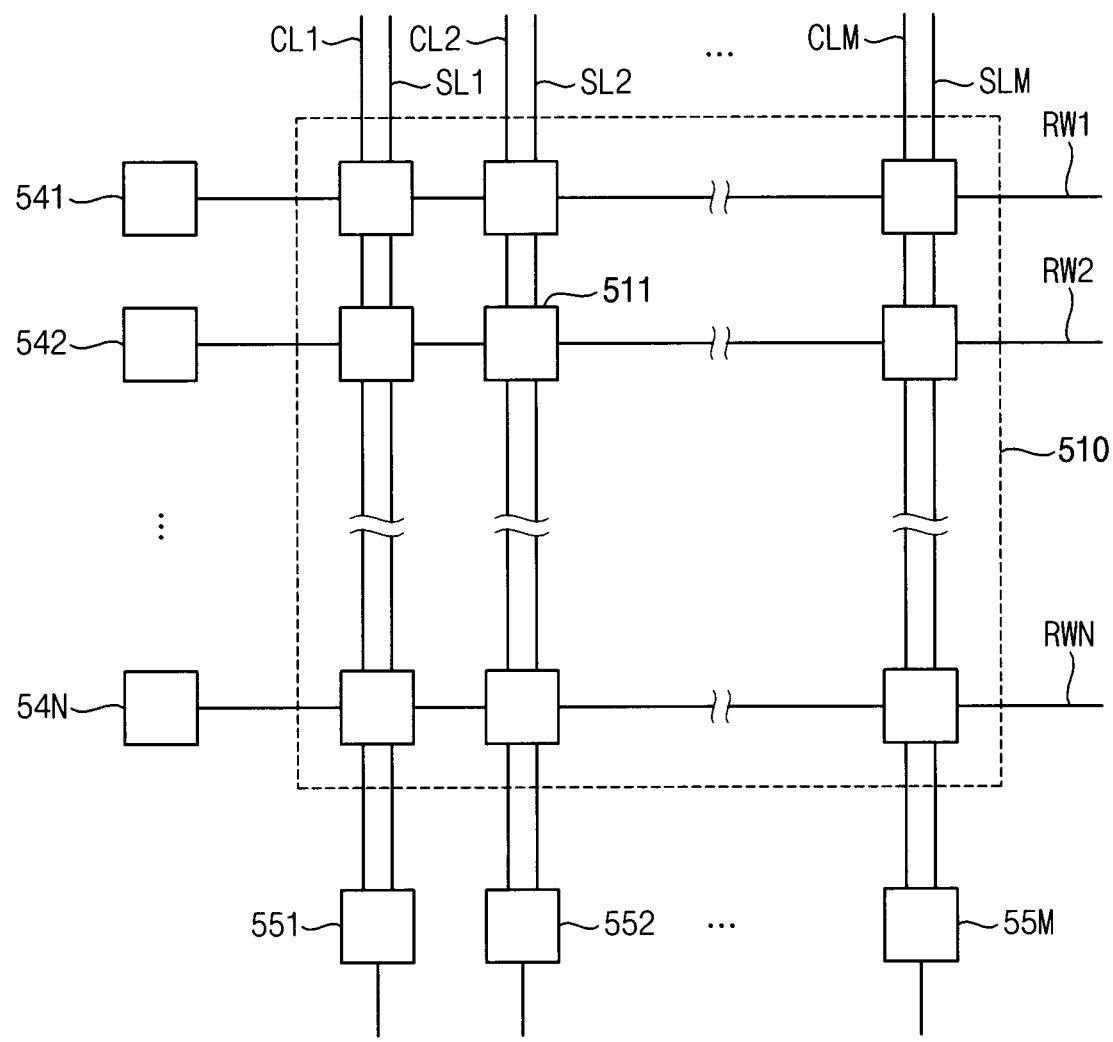
FIG. 15 is a block diagram illustrating a neuromorphic core die in the stacked neuromorphic device of FIG. 2 according to exemplary embodiments.

FIG. 15 is a block diagram illustrating another example (501) of the neuromorphic core dies 300a to 300d in the stacked neuromorphic device 90 of FIG. 2 according to exemplary embodiments.

Referring to FIG. 15, the neuromorphic core die 501 may include a synapse array 510, a plurality of first neurons 541, 542, . . . , 54N and a plurality of second neurons 551, 552, . . . , 55M. Each of the first neurons 541, 542, . . . , 54N may be referred to as a pre-synaptic neuron and each of the second neurons 551, 552, . . . , 55M may be referred to as a post-synaptic neuron.

The synapse array 510 includes a plurality of synapses 511, the synapse array 510 are connected to the first neurons 541, 542, . . . , 54N through a plurality of row lines RW1, RW2, . . . , RWN and the synapse array 510 are connected to the second neurons 551, 552, . . . , 55M through a plurality of column lines CL1, CL2, . . . , CLM and a plurality of selection lines SL1, SL2, . . . , SLM.

The synapse array 510 may store weights included in a plurality of layers of a neural network system and may perform calculation based on the weights and the input data.

Figure 16:
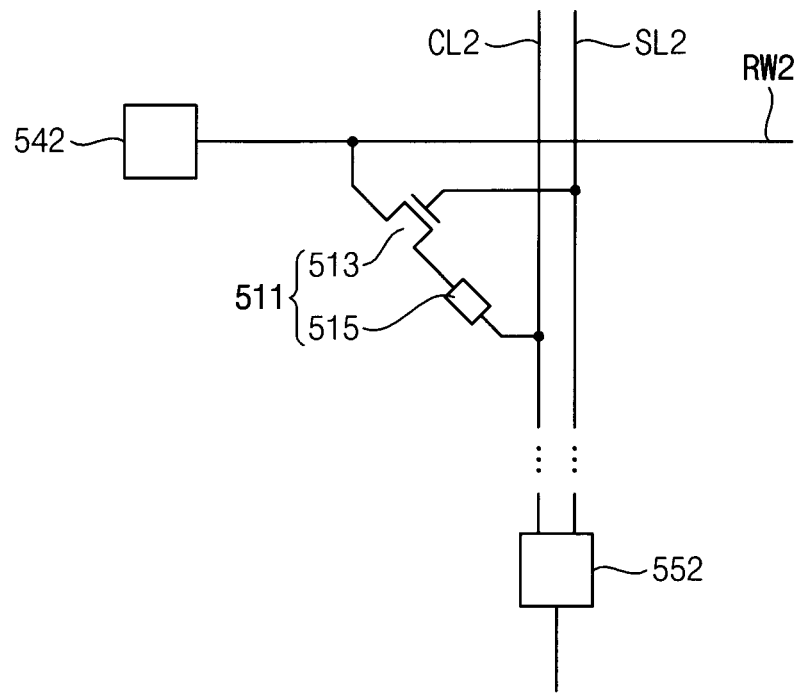
FIG. 16 further illustrates in one example the synapses in the synapse array of FIG. 15 according to exemplary embodiments.

FIG. 16 further illustrates in one example the synapses of the synapse array in FIG. 15 according to exemplary embodiments.

In FIG. 16, a synapse 511, a first neuron 542 connected to the synapse 511 through the row line RW2 and a second neuron 552 connected to the synapse 511 through the column line CL2 and a selection line SL2.

Referring to FIG. 16, synapse 511 includes a switching device 513 and a memristor 515, which are electrically connected with each other in series. The switching device 513 includes a 3-terminal selector such as a metal oxide semiconductor (MOS) transistor or a 2-terminal selector such as a diode. For example, in an embodiment in FIG. 16, the synapse 511 may include a switching transistor, as the switching device 513, electrically connected with the memristor 515 in series. When the switching device 513 is a switching transistor, a gate electrode of the switching transistor may be electrically connected with the second neuron 552 through the selection line SL2, a drain electrode of the switching transistor may be electrically connected with the first neuron 542 through the row line RW2, and a source electrode of the switching transistor may be electrically connected with a first electrode of the memristor 515. A second electrode of the memristor 515 may electrically connected with the second neuron 552 through the column line CL2.

Referring to FIGS. 15 and 16, a row signal may be provided from the first neuron 511 to the synapse 511 through the row line RW2. When the switching device 513 of the synapses 511 is turned on, the row signal may be provided to the memristor 515. The row signal may control a resistance state of the memristor 515 by training the memristor 515 in any of a learning mode, an initializing mode, a potentiating mode, a set mode, a depressing mode, and a reset mode, or the row signal may be converted into a current value depending on the resistance state of the memristor 151. In other words, the resistance state of the memristor 515 may be changed by the row signal, or a current value depending on the resistance state of the memristor 515 may be output to the column line CL2 by the row signal. That is, when the switching device 513 of the synapses 511 is turned on, a synapse weight may be provided and output to the column line CL2.

Figure 17:
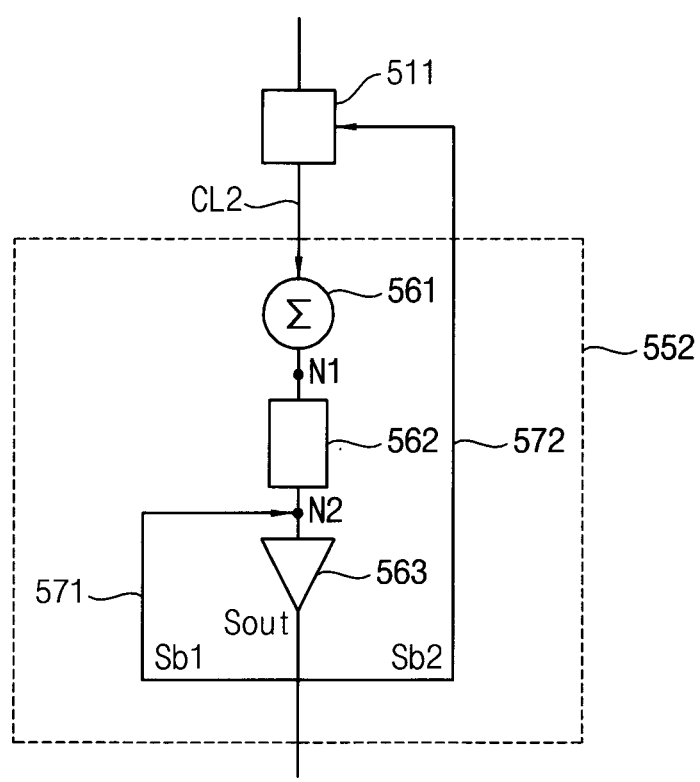
FIG. 17 further illustrates one example of the second neuron of FIG. 16 according to exemplary embodiments.

FIG. 17 further illustrates in one example the second neuron of FIG. 16 according to exemplary embodiments.

Referring to FIG. 17, the second neuron 552 may include a summation circuit 561 electrically connected in series with a variable resistor 562 and a comparator 563.

An output node of a synapse 551, e.g., a column line CL2, may be electrically connected with an input terminal of the summation circuit 561. An output terminal of the summation circuit 561 may be electrically connected with a first electrode of the variable resistor 562 through a first node N1. A second electrode of the variable resistor 562 may be electrically connected with an input terminal of the comparator 563 through a second node N2. The second neuron 552 may further include a first feed-back line 571, which electrically connects an output terminal of the comparator 563 to the variable resistor 562, and a second feed-back line 572, which electrically connects the output terminal of the comparator 563 to the synapse 511. The first feed-back line 571 may be electrically connected with the second node N2, and the second feed-back line 572 may be electrically connected with a selection line SL2. In certain exemplary embodiments, the second feed-back line 572 may be a portion of the selection line SL2.

The summation circuit 561 may sum synapse weights of a plurality of synapses 511 on the same column line CL2, and may provide the summation of the synapse weights to the variable resistor 562. For example, the summation circuit 561 may include any of an adding circuit and an integrating circuit.

A resistance value or a conductance of the variable resistor 562 may be changed depending on outputs of the summation circuit 561 and/or the comparator 563. For example, the resistance value of the variable resistor 562 may be decreased according to the output of the summation circuit 561 in a set operation, and may be increased according to the output of the comparator 563 in a reset operation. For example, when a synapse current summed by the summation circuit 561 is relatively low, the variable resistor 562 may have a relatively high resistance level. Accordingly, a relatively low current and a relatively low synapse weight may be provided to the comparator 563. In contrast, when the synapse current summed by the summation circuit 561 is relatively high, the variable resistor 562 may have a relatively low resistance level. Accordingly, a relatively high current and a relatively high synapse weight may be provided to the comparator 563.

When the output of the variable resistor 562 is higher than a reference voltage of the comparator 563, the comparator 563 may output electrical signals. That is, the comparator 563 of the second neuron 552 may be fired. The electrical signals outputted by the fired comparator 563 may be output signals Sout. Portions of the output signals Sout may divaricate as first feed-back signals Sb1 and second feed-back signals Sb2.

The first feed-back signals Sb1 divaricated from the output signals Sout of the comparator 563 may be provided to the second electrode of the variable resistor 562 through the first feed-back line 571 and the second node N2, and may initialize the variable resistor 562. The output terminal of the comparator 563 may be electrically connected with a gate electrode of the switching transistor of the synapse 511 through the second feed-back line 572 and/or the selection line SL2. Accordingly, the second feed-back signals Sb2 divaricated from the output signals Sout of the comparator 563 may be provided to the gate electrode of the switching transistor and may set or reset the memristor 515 of the synapse 511. For example, the second feed-back signals Sb2 may be used as electrical signals for initiating a STDP operation, which changes the synapse weight of the synapse 511.

Figure 18:
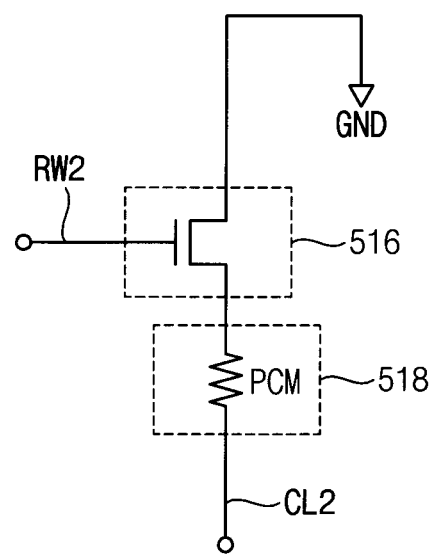
FIG. 18 further illustrates one example of the synapses in the synapse array of FIG. 15 according to exemplary embodiments.

FIG. 18 further illustrates in one example the synapses in the synapse array of FIG. 15 according to exemplary embodiments.

Referring to FIG. 18, a synapse 511a includes a transistor 516 and a phase-change device 518. The transistor 516 has a drain terminal connected to a ground voltage GND, a gate terminal connected to the row line RW2 and a source terminal connected to the phase-change device 518. The phase-change device 518 has a first terminal connected to the drain terminal of the transistor 516 and a second terminal connected to the column line CL2. The phase-change device 518 may store weight based on a change of a resistance value.

When the synapse 511a is included in the synapse array 510 in FIG. 15, the synapse array 510 may perform multiplication operation on the weights and the input data.

Figure 19:
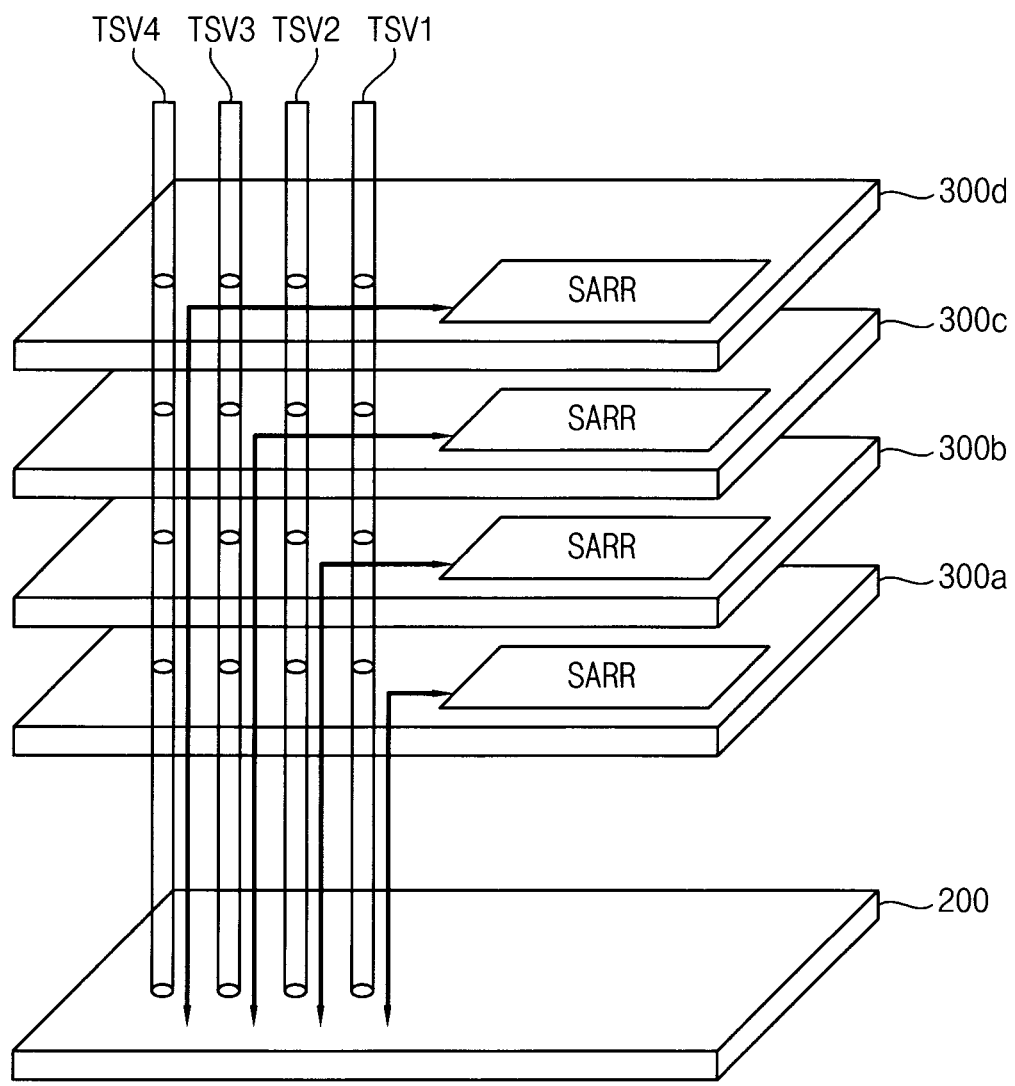
FIG. 19 is a diagram illustrating a data transfer path during an access operation in a stacked neuromorphic device according to exemplary embodiments.

FIG. 19 is a diagram illustrating in one example a data transfer path that may be used during a data access operation performed by a stacked neuromorphic device according to exemplary embodiments. FIGS. 20A and 20B are respective diagrams further illustrating possible implementations for the data transfer path of FIG. 19. In FIGS. 20A and 20B, bold transmission and reception circuits indicate they are enabled.

Referring to the stacked neuromorphic device of FIG. 19, each of the first through fourth neuromorphic core dies 300a, 300*b*, 300*c* and 300*d* includes a synapse array SARR including a plurality of synapses. In addition, data may be exchanged between the logic die 200 and the first through fourth neuromorphic core dies 300*a*, 300*b*, 300*c* and 300*d* through first, second, third and fourth TSVs (TSV1, TSV2, TSV3 and TSV4) respectively corresponding to the first through fourth neuromorphic core dies 300*a*, 300*b*, 300*c* and 300*d*.

That is, during read/write operations, data may be exchanged between the logic die 200 and the first neuromorphic core dies 300*a* through the first TSV TSV1, data may be exchanged between the die 200 and the second neuromorphic core dies 300*b* through the second TSV TSV2, data may be exchanged between the logic die 200 and the third neuromorphic core dies 300*c* through the third TSV TSV3, and data may be exchanged between the logic die 200 and the fourth neuromorphic core dies 300*d* through the fourth TSV TSV4.

Each of first through fourth TSVs TSV1~TSV4 may include a plurality of data paths and each data path may extend in the vertical direction by connecting the through-silicon electrodes respectively formed in the first through fourth neuromorphic core dies 300*a*, 300*b*, 300*c* and 300*d*.

Referring to FIGS. 20A and 20B, the logic die 200 and the neuromorphic core dies 300*a*, 300*b*, 300*c* and 300*d* may include transmission circuits TX and reception circuits RX, respectively, to perform bi-directional communication through the TSVs TSV1~TSV4. The transmission circuits TX and the reception circuits RX corresponding to the first through fourth TSVs TSV1~TSV4 may be formed in all of the neuromorphic core dies 300*a*, 300*b*, 300*c* and 300*d*. This may provide for uniform manufacturing process. Further, the transmission circuits TX and the reception circuits RX may be enabled selectively for a required data communication.

FIG. 20A illustrates a data transfer path corresponding to storing weights and FIG. 20B illustrates a data transfer path corresponding to transferring results of calculations.

Referring to FIG. 20A, during the weights-storing operation, the transmission circuits TX of the logic die 200 and the reception circuits RX of the neuromorphic core dies 300*a*, 300*b*, 300*c* and 300*d* may be enabled to transfer write data from the logic die 200 to the neuromorphic core dies 300*a*, 300*b*, 300*c* and 300*d* through the TSVs TSV1~TSV4, respectively.

A first transmission circuit TX1 of the logic die 200 and a first reception circuit RX11 of the first neuromorphic core die 300*a* may be enabled to transfer first weights WDT1 through the first TSV TSV1. A second transmission circuit TX2 of the logic die 200 and a second reception circuit RX22 of the second neuromorphic core die 300*b* may be enabled to transfer second weights WDT2 through the second TSV TSV2. A third transmission circuit TX3 of the logic die 200 and a third reception circuit RX33 of the third neuromorphic core die 300*c* may be enabled to transfer third weights WDT3 through the third TSV TSV3. A fourth transmission circuit TX4 of the logic die 200 and a fourth reception circuit RX44 of the fourth neuromorphic core die 300*d* may be enabled to transfer fourth weights WDT4 through the fourth TSV TSV4.

Referring to FIG. 20B, during transmission of results of calculations, the transmission circuit TX of the neuromorphic core dies 300*a*, 300*b*, 300*c* and 300*d* and the reception circuit RX of the logic die 200 may be enabled to transfer data corresponding to the results of calculations from the neuromorphic core dies 300*a*, 300*b*, 300*c* and 300*d* to the logic die 200 through the TSVs TSV1~TSV4, respectively.

A first transmission circuit TX11 of the first neuromorphic core die 300*a* and a first reception circuit RX1 of the logic die 200 may be enabled to transfer read data RD1 through the first TSV TSV1. A second transmission circuit TX22 of the second neuromorphic core die 300*b* and a second reception circuit RX2 of the logic die 200 may be enabled to transfer read data RD2 through the second TSV TSV2. A third transmission circuit TX33 of the third neuromorphic core die 300*c* and a third reception circuit RX3 of the logic die 200 may be enabled to transfer read data RD3 through the third TSV TSV3. A fourth transmission circuit TX44 of the fourth neuromorphic core die 300*d* and a fourth reception circuit RX4 of the logic die 200 may be enabled to transfer read data RD4 through the fourth TSV TSV4.

In exemplary embodiments, the layer controller 240 in the control circuit 201*a* of FIG. 4, may control data transmission between the neuromorphic core dies 300*a*, 300*b*, 300*c* and 300*d*. For example, the layer controller 240 may control the data transmission such that the data output from the first neuromorphic core die 300*a* is provided to the second neuromorphic core die 300*b*.

Figure 21:
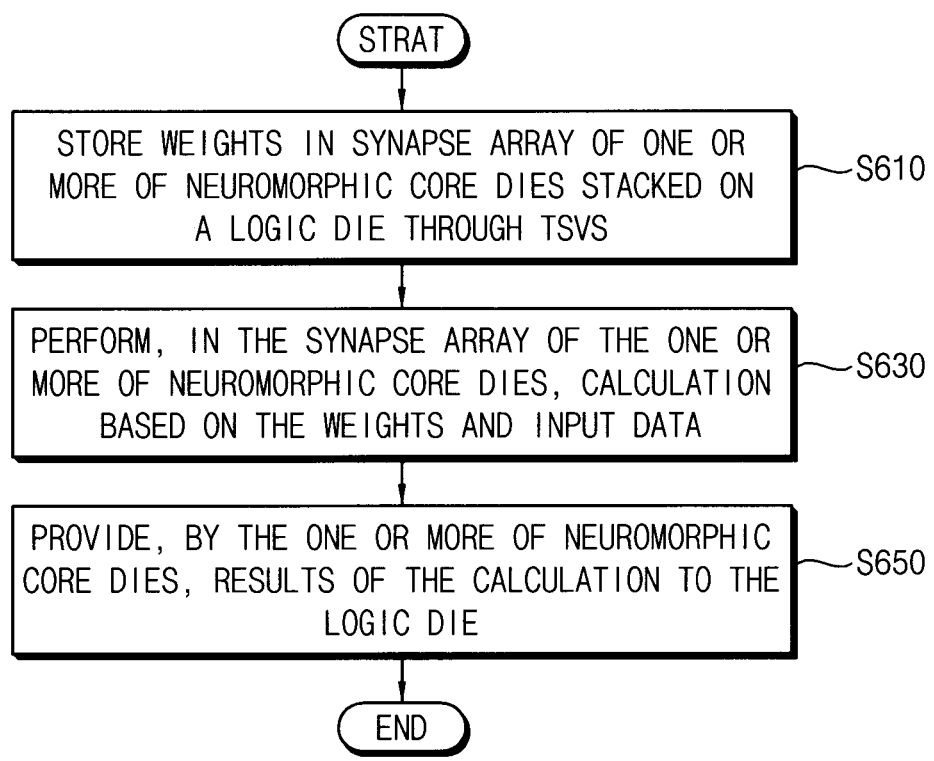
FIG. 21 is a flow chart summarizing a method of operating a stacked neuromorphic device according to exemplary embodiments.

FIG. 21 is a flow chart illustrating a method of operating a stacked neuromorphic device according to exemplary embodiments.

Referring to the foregoing embodiments, there is provided a method of operating a stacked neuromorphic device 90 which includes a logic die 200 and a plurality of neuromorphic core dies 300 stacked on the logic die 200. According to the method, weights are stored in one or more of the neuromorphic core dies 300 through TSVs 220 that penetrate the neuromorphic core dies 300 (S610). A synapse array of the one or more of the neuromorphic core dies 300 performs calculation based on input data and the weights (S630). The one or more of the neuromorphic core dies 300 provides results of the calculations to the logic die 200 through the TSVs 220 (S650).

Figure 22:
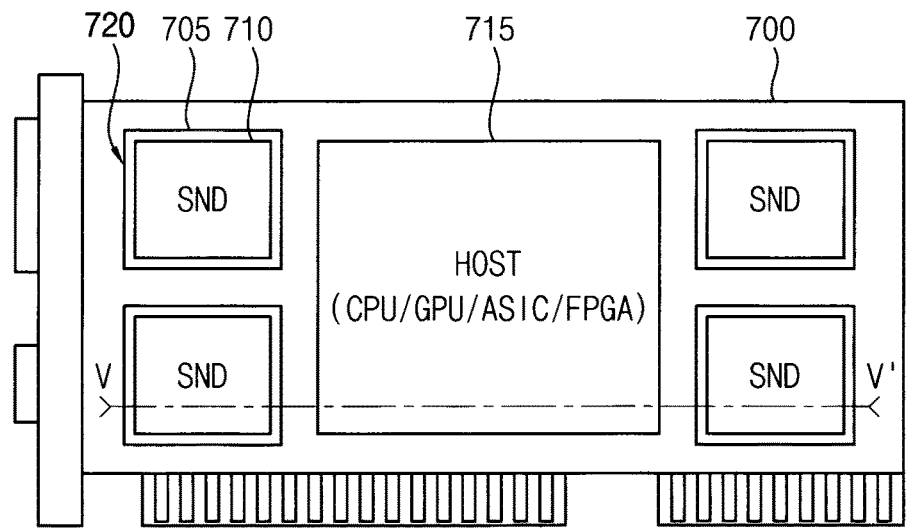
FIG. 22 is a block diagram illustrating a neuromorphic computing system according to exemplary embodiments.

FIG. 22 is a block diagram illustrating a neuromorphic computing system according to exemplary embodiments.

Referring to FIG. 22, a neuromorphic computing system 700 may include a host 715 and at least one stacked neuromorphic device 720.

The host 715 may include at least one of a central processing unit (CPU), a graphics processing unit (GPU), an application specific integrated circuit (ASIC), or a field programmable gate array (FPGA). The at least one stacked neuromorphic device 720 may include a logic die 705 and a plurality of neuromorphic core dies 710 stacked on the logic die 705. The neuromorphic computing system 700 may be peripheral component interconnect express (PCI-e) compatible board.

Figure 23:
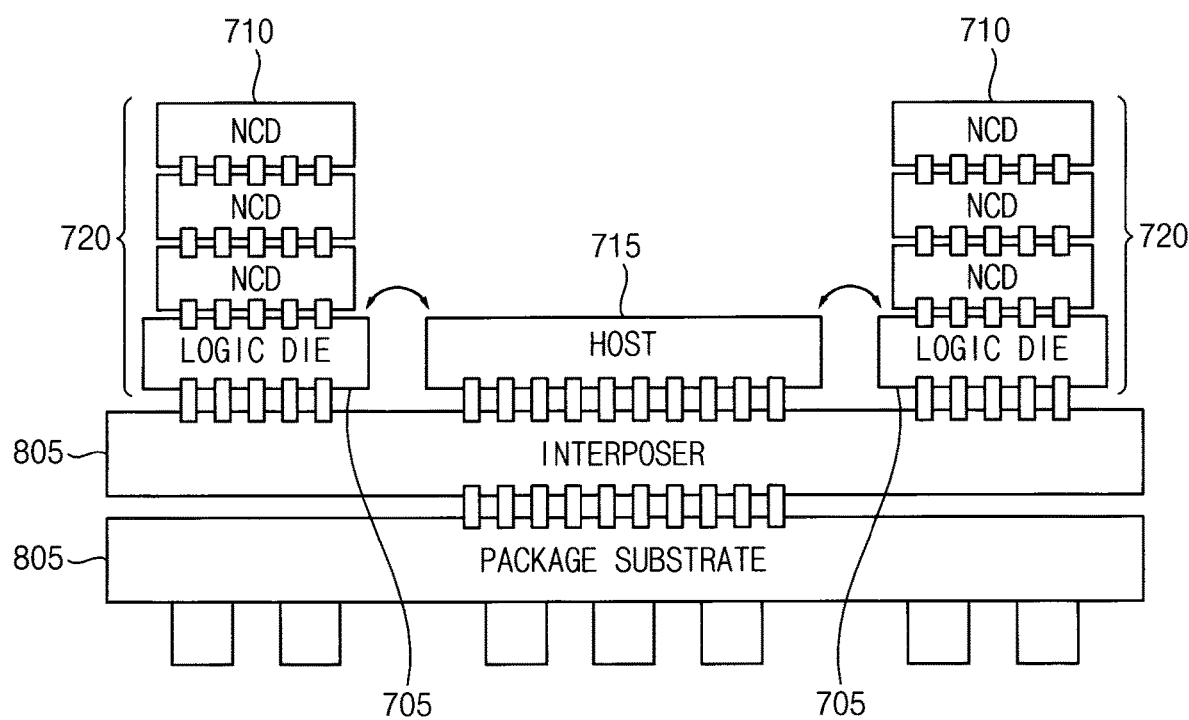
FIG. 23 a cross-sectional view of the neuromorphic computing system of FIG. 22 taken along line V-V'.

FIG. 23 illustrates a cross-sectional view of the neuromorphic computing system of FIG. 22 taken along line V-V'.

Referring to FIG. 23, the plurality of neuromorphic core dies 710 are staked in the logic die 705, forming the stacked neuromorphic device 720.

A plurality of stacked neuromorphic devices 720 may be included on the neuromorphic computing system 700. The host 715 may communicate with each of the logic dies 705. The host 715 and the logic dies 705 may be disposed atop and connected to an interposer 805. The interposer 805 may be disposed atop and connected to a package substrate 810.

Each of the stacked neuromorphic devices 720 may employ the stacked neuromorphic device 90*a* of FIG. 3. Therefore, each of the stacked neuromorphic devices 720 receives the request, weights and the input data, stores the weights and provides the final data to the host 705. Each of the neuromorphic core dies 710 may include a synapse array including a plurality of synapses which store weights of a plurality of layers constituting a neural network system and perform calculations based on the weights and the input data.

In the neuromorphic computing system 700, the logic die 705 may perform basic input/output (I/O) operations, leading to lower latency and better memory traffic. Machine learning algorithms benefit from this architecture, as they require intensive bandwidth for training and prediction. A processor-near-memory assists the host 715 by way of the die 705. The logic die 705 then implements specialized logic functions, which may be specific to machine learning applications which have special high bandwidth requirements. Consequently, system performance improves and the energy consumption decreases.

Aspects of the present inventive concept may be applied to various devices that employ artificial intelligence to increase data processing efficiency.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims.

What is claimed is:

1. A stacked neuromorphic device comprising:
a logic die including a control circuit and configured to communicate with a host; and
a plurality of core dies stacked on the logic die and connected to the logic die through a plurality of through silicon vias (TSVs) extending through the plurality of core dies,
wherein the plurality of core dies includes a neuromorphic core die,
the neuromorphic core die includes a synapse array connected to a plurality of row lines and a plurality of column lines,
the synapse array includes a plurality of synapses configured to store weights and perform a calculation based on the weights and input data, the weights being included in a plurality of layers of a neural network system, and
the control circuit is configured to provide the weights to the neuromorphic core die through the TSVs, and to control data transmission by the neuromorphic core die.

2. The stacked neuromorphic device of claim 1, wherein the calculation includes a multiplication operation and an accumulation operation, and
the plurality of synapses is further configured to perform the multiplication operation based on the weights and the input data and to perform the accumulation operation on results of the multiplication operation to provide an accumulation result.

3. The stacked neuromorphic device of claim 2, wherein the neuromorphic core die further includes a data processor connected to the synapse array and configured to provide the accumulation result to the control circuit through the TSVs.

4. The stacked neuromorphic device of claim 1, wherein the calculation includes a multiplication operation, and
the plurality of synapses is further configured to perform the multiplication operation based on the weights and the input data.

5. The stacked neuromorphic device of claim 4, wherein the neuromorphic core die further includes a data processor connected to the synapse array and configured to provide a result of the multiplication operation to the control circuit through the TSVs, and
the control circuit includes an accumulator configured to provide an accumulation result based on the result of the multiplication operation.

6. The stacked neuromorphic device of claim 1, wherein the calculation includes a multiplication operation and an accumulation operation,
the plurality of synapses is further configured to:
perform the multiplication operation based on the weights and the input data and in conjunction with the neural network system,
perform the accumulation operation on results of the multiplication operation in conjunction with the neural network system to provide an accumulation result, and
generate a plurality of read currents based on the input data and the weights, wherein the plurality of read currents are determined from the results of the multiplication operation and the accumulation result, and
the neuromorphic core die includes:
a plurality of current-to-voltage converters configured to convert the plurality of read currents into a plurality of signal voltages;
a plurality of analog-to-digital converters configured to convert the plurality of signal voltages into a plurality of digital signals;
a plurality of adders configured to sum the plurality of digital signals; and
a plurality of shift registers configured to generate output data based on an output of the plurality of adders.

7. The stacked neuromorphic device of claim 1, wherein the synapse array further includes first neurons connected to the synapses through the row lines, and second neurons connected to the synapses through the column lines, and
each of the synapses in the synapse array includes a memristor having a changeable resistance value, and a transistor connected to the memristor, wherein the transistor is configured to receive at least two input signals, and the changeable resistance value of the memristor is changed based on a time difference between the at least two input signals received by the transistor.

8. The stacked neuromorphic device of claim 7, wherein the changeable resistance value of the memristor is changed based on a voltage change caused by the time difference between the at least two input signals.

9. The stacked neuromorphic device of claim 7, wherein the changeable resistance value of the memristor is changed based on a time difference between a first input signal applied to a gate terminal of the transistor and a second input signal based on a membrane voltage applied to a source terminal of the transistor.

10. The stacked neuromorphic device of claim 9, wherein a direction of a current flowing on the memristor is determined by a voltage difference caused by the time difference between the first input signal and the second input signal.

11. The stacked neuromorphic device of claim 7, wherein each of the second neurons is configured to generate a spike fired with reference to a resting voltage.

12. The stacked neuromorphic device of claim 1, wherein the synapse array further includes:

first neurons respectively connected to the synapses through the row lines and second neurons respectively connected to the synapses through the column lines, the synapses respectively include a switching device connected in series with a memristor, and the second neurons respectively include a summation circuit connected in series with a variable resistor and a comparator.

13. The stacked neuromorphic device of claim 12, wherein each of the second neurons further includes:

a first feed-back line that electrically connects an output terminal of the comparator to the variable resistor; and a second feed-back line that electrically connects the output terminal of the comparator to the switching device, and each of the second neurons is configured to provide the variable resistor with a first portion of an output signal of the comparator through the first feed-back line and is configured to provide the switching device with a second portion of the output signal of the comparator through the second feed-back line.

14. The stacked neuromorphic device of claim 1, wherein the synapse array further includes first neurons connected to the synapses through the row lines and second neurons connected to the synapses through the column lines, the synapses respectively include a transistor connected in series with a phase change device, the transistor includes a source terminal connected to ground voltage and a gate terminal connected to one of the row lines, and the phase change device includes a first terminal connected to a source terminal of the transistor and a second terminal connected to one of the column lines.

15. The stacked neuromorphic device of claim 1, wherein the control circuit includes an input/output interface configured to communicate with the host and a layer controller configured to control data transmission by the neuromorphic core die.

16. The stacked neuromorphic device of claim 1, wherein at least one the plurality of core dies includes a memory core die configured to store calculation results provided by the neuromorphic core die, and the memory core die includes at least one of volatile memory cells and nonvolatile memory cells.

17. A neuromorphic computing system comprising a host and a stacked neuromorphic device, wherein the stacked neuromorphic device includes a logic die configured to communicate with the host, a plurality of core dies stacked on the logic die, and a plurality of through silicon vias (TSVs) extending through the plurality of core dies to connect to the plurality of core dies to the logic die, at least one of the plurality of core dies includes at least one neuromorphic core die, the at least one neuromorphic core die including a synapse array connected to a plurality of row lines and a plurality of column lines, the synapse array includes a plurality of synapses configured to store weights and to perform a calculation based on the weights and an input data, and the weights are included in a plurality of layers constituting a neural network system, and the logic die includes a control circuit configured to provide the weights to the at least one neuromorphic core die through the TSVs and to control data transmission among the at least one neuromorphic core dies.

18. The neuromorphic computing system of claim 17, wherein the calculation includes a multiplication operation and an accumulation operation, and the plurality of synapses is further configured to perform the multiplication operation based on the weights and the input data and to perform the accumulation operation on results of the multiplication operation to provide an accumulation result, the at least one neuromorphic core die includes a data processor connected to the synapse array and configured to provide the accumulation result to the control circuit through the TSVs, and the control circuit includes an input/output interface configured to communicate with the host, and a layer controller configured to control data transmission among the at least one neuromorphic core die.

19. The neuromorphic computing system of claim 17, further comprising:

an interposer connected to the host and to the logic die, and a substrate connected to the interposer.

20. A stacked neuromorphic device comprising:

a logic die configured to communicate with a host;

core dies stacked on the logic die; and through silicon vias (TSVs) extending through the core dies to connect the core dies to the logic die, wherein the core dies respectively include neuromorphic core dies, each of the neuromorphic core dies includes a synapse array connected to a plurality of row lines and a plurality of column lines, the synapse array includes a plurality of synapses configured to store weights and configured to perform an accumulation operation based on results of a multiplication operation based on the weights and an input data, the weights are included in a plurality of layers of a neural network system, the logic die includes a control circuit configured to provide the weights to the neuromorphic core dies through the TSVs and to control data transmission among the neuromorphic core dies the neuromorphic core dies respectively include a data processor connected to the synapse array and configured to provide an accumulation result of the accumulation operation to the control circuit through the TSVs, and the control circuit includes an input/output interface configured to communicate with the host, and a layer controller configured to control data transmission among the neuromorphic core dies.

* * * * *